United States Patent [19]
Williams et al.

[11] Patent Number: 5,767,546
[45] Date of Patent: *Jun. 16, 1998

[54] LATERAL POWER MOSFET HAVING METAL STRAP LAYER TO REDUCE DISTRIBUTED RESISTANCE

[75] Inventors: Richard K. Williams, Cupertino; Mohammad Kasem, Santa Clara, both of Calif.

[73] Assignee: Siliconix incorporated, Santa Clara, Calif.

[*] Notice: The term of this patent shall not extend beyond the expiration date of Pat. No. 5,665,996.

[21] Appl. No.: 367,388

[22] Filed: Dec. 30, 1994

[51] Int. Cl.$^6$ .................. H01L 29/76; H01L 23/48
[52] U.S. Cl. .................. 257/343; 257/758; 257/766; 257/776; 257/774
[58] Field of Search ............. 257/343, 341, 257/753, 758, 763, 766, 774, 781, 773, 784, 728, 690, 737, 751, 776

[56] References Cited

U.S. PATENT DOCUMENTS

| | | | |
|---|---|---|---|
| 3,667,008 | 5/1972 | Katnack | 317/235 R |
| 4,268,849 | 5/1981 | Gray et al. | 357/71 |
| 4,767,722 | 8/1988 | Blanchard | 437/41 |
| 4,864,370 | 9/1989 | Gaw et al. | 357/17 |
| 4,984,061 | 1/1991 | Matsumoto | 257/784 |
| 5,023,692 | 6/1991 | Wodarczyk et al. | 357/43 |
| 5,192,989 | 3/1993 | Matsushita et al. | 257/343 |
| 5,270,253 | 12/1993 | Arai et al. | 437/189 |
| 5,272,111 | 12/1993 | Kosaki | 437/192 |
| 5,310,699 | 5/1994 | Chikawa et al. | 437/183 |
| 5,315,156 | 5/1994 | Lott | 257/728 |
| 5,321,302 | 6/1994 | Shimawaki | 257/592 |
| 5,355,008 | 10/1994 | Moyer et al. | 257/341 |
| 5,359,220 | 10/1994 | Larson et al. | 257/378 |
| 5,405,794 | 4/1995 | Kim | 437/41 |
| 5,468,984 | 11/1995 | Efland et al. | 257/356 |
| 5,473,193 | 12/1995 | Temple et l. | 257/690 |
| 5,508,229 | 4/1996 | Baker | 437/183 |

FOREIGN PATENT DOCUMENTS

| | | | |
|---|---|---|---|
| 0624909 A3 | 11/1994 | European Pat. Off. | H01L 29/784 |
| 4037876 A1 | 5/1991 | Germany | H01L 29/804 |
| 5314557 | 2/1978 | Japan | 257/766 |
| 54973 | 1/1979 | Japan | 257/766 |
| 58-51511 | 3/1983 | Japan . | |

*Primary Examiner*—Minh-Loan Tran
*Attorney, Agent, or Firm*—Skjerven, Morrill, MacPherson, Franklin & Friel; David E. Steuber

[57] ABSTRACT

To reduce the distributed resistance in an integrated circuit die, a relatively thick metal strap layer is deposited on a bus or other conductive path in the top metal layer. The metal strap layer is formed by etching a longitudinal channel in the passivation layer over the bus and plating a thick metal layer, preferably nickel, in the channel. The metal strap layer dramatically reduces the resistance of the bus.

41 Claims, 25 Drawing Sheets

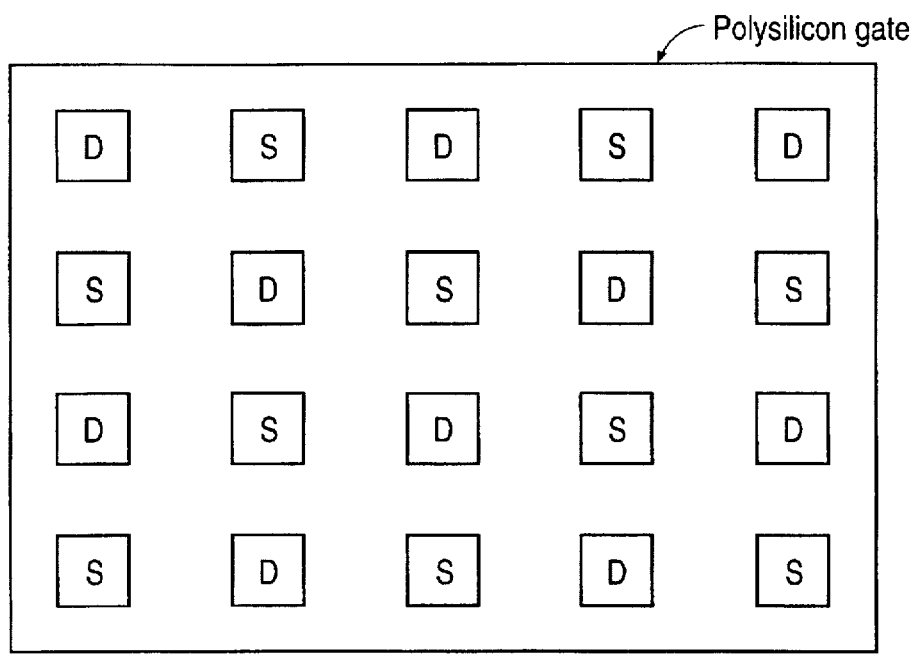
FIG. 5A
(PRIOR ART)
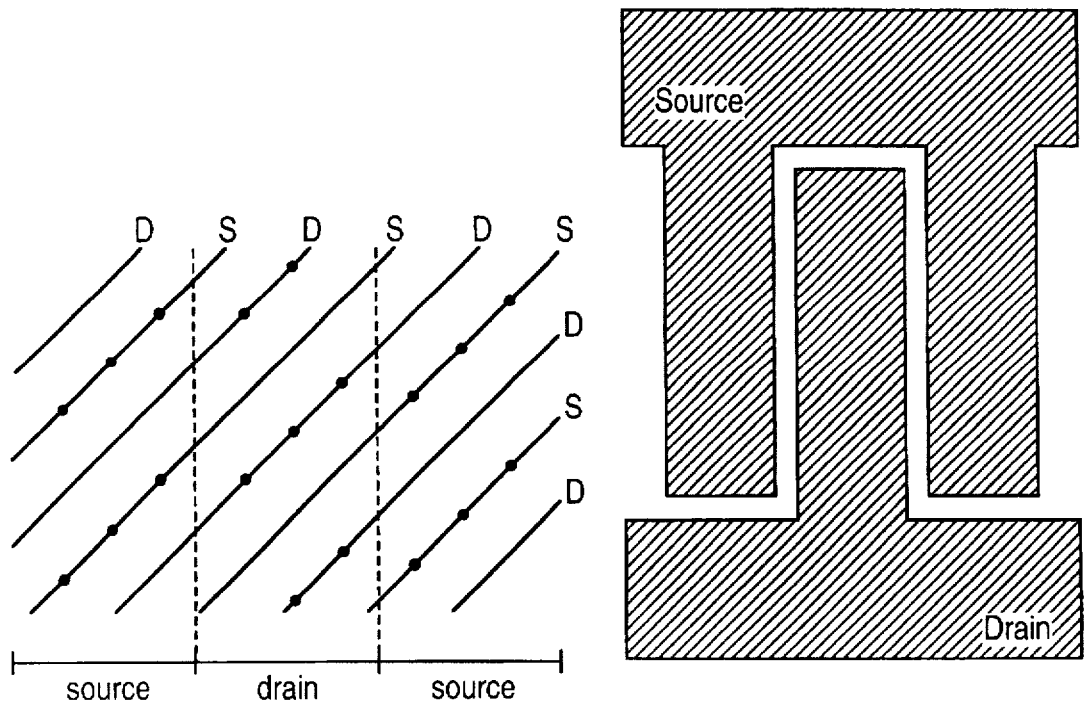
FIG. 5B
(PRIOR ART)
FIG. 5C
(PRIOR ART)

LATERAL POWER MOSFET HAVING METAL STRAP LAYER TO REDUCE DISTRIBUTED RESISTANCE

CROSS-REFERENCE TO RELATED APPLICATION

This application is related to application Ser. No. 08/367,486, filed on even date herewith, which is incorporated herein by reference in its entirety.

FIELD OF THE INVENTION

This invention relates to lateral power MOSFETs fabricated in the form of an integrated circuit and, in particular, to an integrated circuit which has reduced resistances in the buses and other conduction paths linking internal MOSFETs and other components to each other and to external devices.

BACKGROUND OF THE INVENTION

The total resistance of a power MOSFET when it is turned on is generally the sum of the resistances of the metal conductors (bonding wires, buses, etc.) and the channel resistance. The performance of power MOSFETs fabricated as integrated circuits (ICs) has suffered in comparison with the performance of their discrete counterparts because of the resistance of the metal conductors. This problem was overcome temporarily by the introduction of dual-layer metallization into power ICs. More recently, however, further reductions in the channel resistance of vertical and lateral power MOSFETs have once again focused attention on the resistance of the metal interconnects. In some cases, for example, where cross-chip busing is required, the metal resistance can exceed the resistance of the silicon devices.

In a conventional IC power MOSFET, the metal layers are deposited by sputtering, chemical vapor deposition, or evaporation and are overlain by a passivation layer which is typically formed of silicon nitride or some type of glass (e.g., borophosphosilicate glass). Increasing the thickness of metal layers so fabricated to minimize their contribution to resistance is in many ways incompatible with the desire for increased packing density within the IC. Moreover, even at a thickness of 1 μm, a sheet resistance of 30 mΩ/square can present a significant problem in the design of a 50 mΩ lateral power MOSFET. As operating voltages decline from 12 V to 5 V, and even to 3 V, the size of the individual device cells has been reduced. In a closed-cell array of alternating source and drain cells, for example, which is currently the preferred structure, reducing the size of the cells forces the first metal layer to a tighter pitch and smaller contacts. In some embodiments, this pitch requirement reduces the thickness of the first metal layer to 1 μm or below, even as low as 0.3 μm. Moreover, a thick first metal layer may complicate the planarization process needed to avoid step coverage problems in the second metal layer.

Increasing the thickness of the second metal layer also presents problems, particularly in the etching process. Beyond a thickness of 2 μm, dry etching becomes difficult due to the need for a thick photoresist and due to complexities in the metal etch process itself (i.e., redeposition of etched materials, changes in gas stoichiometry, heating, etc.). Wet etching suffers from lift off of the resist, which leads to notching ("mouse biting") and requires very large metal-to-metal spacing (for example, 15 μm for a 4 μm thick metal layer) and a large metal overlap of vias. A metal layer meeting these requirements is useless in the logic areas of the IC, because the minimum line widths and spacing permitted yield too large a pitch and too few interconnects per unit area to allow for dense packing of logic.

Metal resistance impacts two areas of power IC design in particular: (i) the buses between devices and along the edge of the die, and (ii) the conductive fingers within a given lateral power device. In the buses between devices the metal acts as a series resistance element. Its contribution to total resistance can be calculated by the number of squares times its sheet resistance. Consider, for example, the three-phase push-pull motor driver shown in FIG. 1A. The drive consists of six transistors, three high-side and three low-side. All three low-side MOSFETs $A_{LSS}$, $B_{LSS}$, and $C_{LSS}$ must have a low resistance connection to the ground pad of the IC. Likewise, all three high-side devices, $A_{HSS}$, $B_{HSS}$, and $C_{HSS}$ must share a common low-resistance bus to a $V_{DD}$ pad. Each phase has an output pad ($A_{out}$, $B_{out}$ and $C_{out}$) located schematically at the common node between the high-side and low-side MOSFET. Thus, at least five power pads are required. Unfortunately, the output pads cannot be located in the center of the die, as shown in FIG. 1B. "Deep" bond wires, i.e., bond wires which extend from the edge of the die (where the leadframe is located) to the center of the die are generally forbidden. The risk of a "deep" bond wire shorting to the surface of the die or to another bond wire is too great. Another risk is sagging of the wire where it touches the "scribe street" causing a short to ground (a failure referred to as "wire wash"). In thin profile surface-mount packages, a deep bond wire may even protrude through the top of the plastic package. Moreover, a single bond wire may exhibit a resistance of over 50 mΩ. For these and other reasons, the bond pads in an IC must generally be located near the edge of the die.

Continuing the example, rearranging the push-pull stages to place the output pads near the edge of the die, as shown in FIG. 1C, further lengthens the ground and $V_{DD}$ bus lines, thereby increasing their resistance. The net result is that no layout satisfies the need for low-resistance $V_{DD}$, ground and output connections without increasing the number of power-related pads from five to at least seven.

The resistive contributions of the metal within a device are even more complex. FIG. 2A illustrates an idealized model of a MOSFET M having a bond wire resistance $R_{wire}$, a lumped metal finger resistance $R_{metal}$ and a MOSFET channel resistance. The assumption that the finger resistance can be "lumped" is disproved by reference to FIG. 2B, which shows MOSFETs $M_A$–$M_F$ connected in parallel between a drain finger D and a source finger S. Drain finger D contains five squares designated 1d–5d, and source finger S contains five squares designated 1s–5s.

Assume for the moment that MOSFETs $M_A$–$M_F$ all carry the same current. Notice that, on the source side, the metal square labeled 5s must conduct the current of all six MOSFETs. Square 5d on the drain side carries only the current of MOSFET $M_F$. Instead, the square labeled 1d must handle all of the current. Since more current is flowing in square 1d on the drain side and square 5s on the source side, the voltage drop in these squares is higher than in the other squares. The equivalent circuit is shown in FIG. 2C, wherein the distributed resistances represented by squares 1d–5d and 1s–5s are shown between the individual MOSFETs. Because of this distributed resistance, the MOSFETs cannot be considered in parallel nor can the current through them be considered uniform. The net result is that the equivalent resistance of the network can be higher than the model of the simple lumped resistance of the metal finger added to the parallel resistances of the MOSFETs.

FIG. 3A illustrates the voltage drop along source finger S ($V_{source}$) and drain finger D ($V_{drain}$) when a known current I is forced through the network. As expected, most of the voltage drop occurs at one end of source finger S and at the other end of the drain finger D. The voltage along each finger varies parabolically as more MOSFETs feed current into the finger. Given the nonlinear variation of $V_{source}$ and $V_{drain}$, the voltage across any given MOSFET is the difference between the drain and source finger potentials at that point ($V_{drain}-V_{source}$). Note that, at the two ends, the voltage across the MOSFETs ($M_A$ and $M_F$) is a relatively large percentage of the terminal potential ($V_{DD}$). Halfway down the fingers, however, the voltage drops along each finger become significant, and the voltage across the central MOSFETs ($M_C$ and $M_D$) falls to a minimum. If we assume that the current density is low enough to prevent saturation in any MOSFET, then each MOSFET can be considered as a linear resistance. The current through any given MOSFET is then $V_{ds}/R_{ds}$, wherein $V_{ds}$ is the voltage across the particular MOSFET and $R_{ds}$ is the resistance of the MOSFET.

The curve $C_1$ of FIG. 3B illustrates the voltage $V_{ds}$ across each of MOSFETs $M_A-M_F$. It is clear from FIG. 3B that MOSFETs $M_C$ and $M_D$ at the center of the fingers carry less current than those at the ends. Because they conduct a smaller percentage of the total current, these MOSFETs behave as if they have a higher resistance than the MOSFETs located towards the ends of the fingers. Making a finger even longer adds even more cells to the center that do not carry much current, so the equivalent resistance for a given area of the die increases. As a result, without including any effects due to the gate bias or current saturation of the MOSFETs, the influence of metal finger resistance is to increase the total device resistance nonlinearly with increasing finger length. FIG. 3B also shows the voltage drop that would prevail across each of MOSFETs $M_A-M_F$ in the ideal model with no parasitic resistance (curve $C_3$) and in the lumped resistance model illustrated in FIG. 2A (curve $C_2$).

As the voltage between the gate and source pads is increased by external circuit conditions, the devices at the ends of the fingers go into current saturation first, placing an increased conduction burden on the cells along the center of the fingers. The latter cells then go into saturation sooner than they would otherwise, and the effect cascades. This phenomenon points up the second problem with finger resistance, i.e., the non-uniform current leads to premature saturation of the individual MOSFETs, a smaller region of linear operation, and a non-uniform distribution of power along the metal fingers S and D.

In addition, the distributed resistance along finger S increases the voltage at the end of the finger (MOSFET $M_A$) and therefore reduces the level of gate drive. The farther away the device is from the gate pad, the larger the reduction on gate drive. A lower gate drive voltage ($V_{gs}$) means that the MOSFET will have a higher resistance and saturate sooner.

In the prior art, triangular or wedge-shaped buses have been used to avoid electromigration (a reliability problem resulting from high current densities in a soft metal such as aluminum). This tends to equalize the voltage drops between the MOSFETs along a given bus or finger (i.e., the cross-sectional area of the bus increases in the direction of the pad), but the restrictions imposed on the layout by triangular buses are incompatible with today's high-density device technology. Moreover, as the interdigitated bus arrangement shown in FIG. 4 indicates, the bus resistance problem is two-dimensional: not only does the metal contribute to resistance along a finger (perpendicular to the die edge), but it also adds a distributed effect in the metal source bus and drain bus along the edge of the die. Any attempt to make triangles out of the bus would result in a waste of area having consequences worse than the distributed resistance problem that it was intended to overcome.

FIG. 5A illustrates an array of tightly packed device cells built into a rectilinear grid, some of the advantages of this pattern are discussed in U.S. Pat. No. 5,412,239, incorporated herein by reference. The polysilicon gate is fabricated in a "cookie cutter" geometry, i.e., a sheet with a rectilinear array of openings, the source contacts and drain contacts extending through the openings (labeled S for source, D for drain) in an alternating fashion. As shown in FIG. 5B, the traces of the first metal layer are arranged in a diagonal pattern to connect with all contacts of like type (drain or source). Again S designates a source metal trace; D designates a drain metal trace. Then, as shown in FIG. 5C, the second metal layer includes interdigitated fingers which are arranged in a pattern parallel to the cells such that alternating fingers are connected through vias to the underlying source and drain cells. In other words, via connections between the first and second metal layers occur in alternating "stripes". Under a drain stripe, only vias to "drain" first metal buses are included. (This is shown as the central region in FIG. 5B.) Current in first metal layer source buses in this region must flow laterally to the nearest via under a second metal layer source bus.

What is needed, then, is a means to conduct high currents in an IC power device at low values of laterally distributed resistance. The technique should place minimum restrictions on the geometric patterns of the polysilicon gate and first metal layer so as to allow them to be optimized for achieving the minimum device resistance in a given area. Furthermore, extremely thick passivated metal must be avoided to prevent cracking of the passivant over metal steps. Such cracks may create reliability problems.

SUMMARY OF THE INVENTION

In accordance with this invention, a metal strap layer is deposited on the surface of a bus or other conductive path in an IC die. The metal strap layer is not covered by a passivation layer in the die, and the passivation layer may abut a side edge of the strap layer.

In a preferred embodiment, the metal strap layer includes a relatively thick layer of nickel which is plated electrolessly onto the bus or other conductive path. The bus can be formed of an aluminum layer, which might comprise aluminum-silicon or aluminum-copper-silicon. Since the passivation layer does not overlie the metal strap layer, the thickness of the metal strap layer may be increased to, for example, 20 to 30 μm without causing cracking in the passivation layer.

In a method of fabricating this arrangement, the passivation layer is etched so as to form a longitudinal channel or trench over the bus or other conductive path. In a preferred method, contact with the bus is improved by first depositing or plating an adhesion layer of a metal such as zinc, titanium or platinum. The metal strap layer is then deposited on the thin layer, preferably by electroless plating. Another metal layer (e.g., a gold or silver layer) can be deposited on the top surface of the metal strap layer. Covering the metal strap layer with a thin layer of a metal such as gold or silver allows conventional wire bonding directly to the metal strap layer at the edge of the die, eliminating the need for special packaging techniques.

In another embodiment, a thick gold layer is substituted for the thick nickel layer. This allows a bond wire to be attached directly to the thick layer.

The metal strap layer virtually eliminates the resistance of the underlying bus or other conductive path, reducing the interconnect sheet resistance by a factor of 5 to 30 as compared with conventional interconnect arrangements. The need for "deep" bonds, i.e., long wire bonds extending into the interior of the die, is also eliminated.

A metal strap layer overlying a bus or finger may be used to reduce resistance in any IC which includes single or multiple metal layers. This structure is particularly useful, however, in reducing the on-resistance of lateral power devices integrated with logic or control circuitry in power ICs. The IC may include both conventional metal buses covered by a passivation layer as well as buses overlain by a metal strap layer. While the buses which have an overlying metal strap layer may have to be spaced somewhat more widely than is normal, other buses can be conventionally spaced. In this way, high current buses can be mixed with submicron interconnects without comprising tight design rules. The fabrication of a metal strap layer on buses which are located at the edge of the die reduces the need for an excessive number of wire bonds to minimize the distributed resistance in these buses.

BRIEF DESCRIPTION OF THE DRAWINGS

FIG. 5A illustrates a rectilinear array of MOSFET cells.

FIG. 5B illustrates the layout of the buses in the first metal layer above the rectilinear array of MOSFET cells.

FIG. 5C illustrates the buses in the second metal layer above the rectilinear array of cells.

FIG. 8 illustrates a top view of the device shown in FIG. 7, illustrating the cross section 7—7 at which FIG. 7 is taken.

DESCRIPTION OF THE INVENTION

Figure 1A:
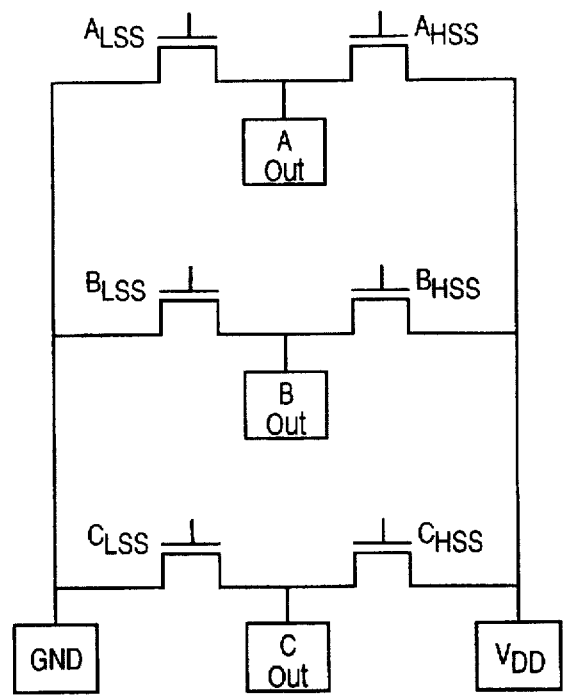
FIG. 1A illustrates a circuit diagram of a conventional three-phase push-pull motor driver.
Figure 1B:
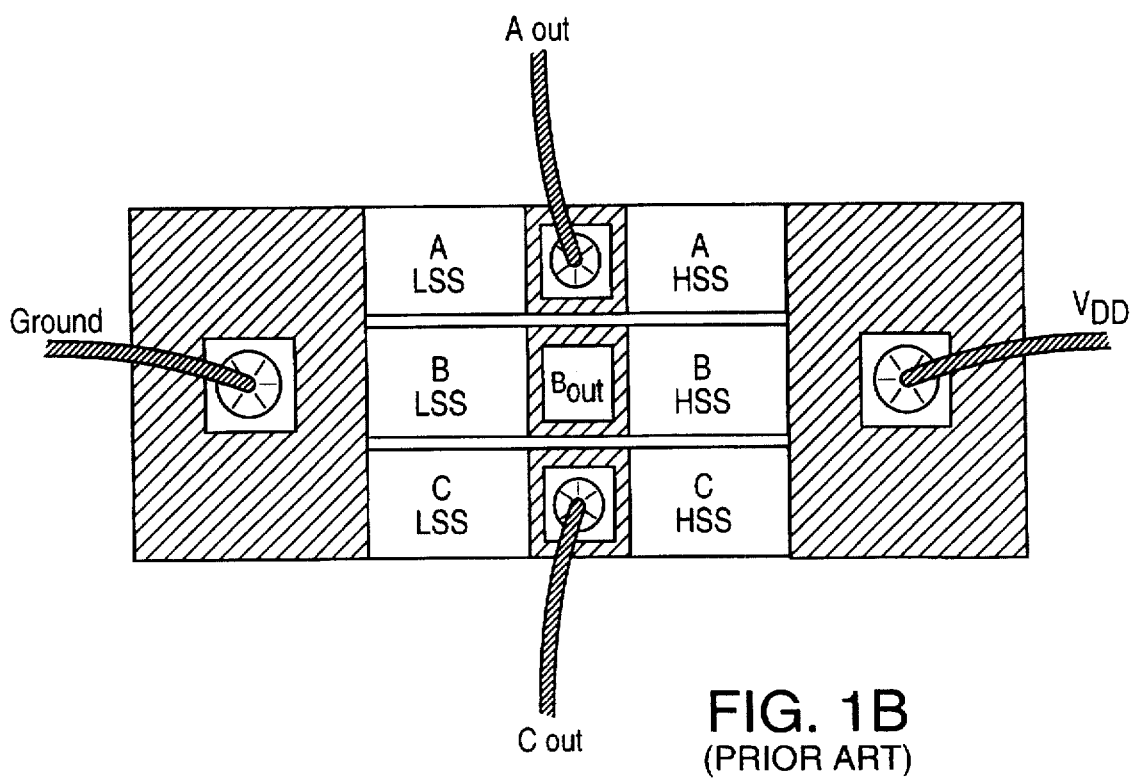
FIG. 1B illustrates a possible layout of an IC die which contains the motor driver of FIG. 1A.
Figure 1C:
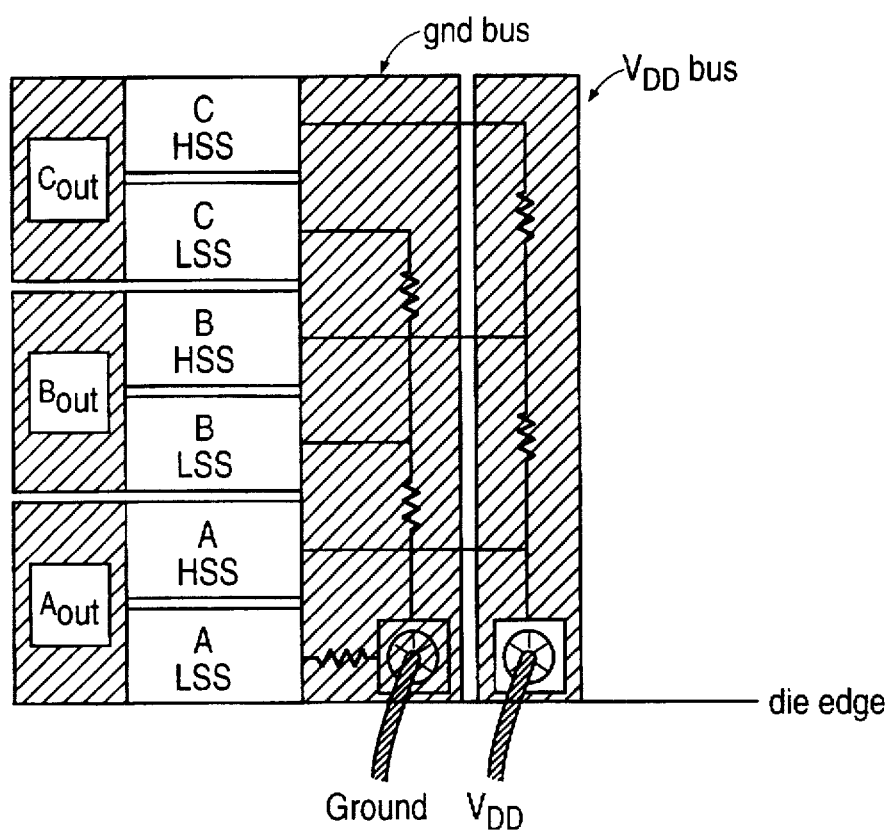
FIG. 1C illustrates an alternative layout of an IC die which contains the motor driver of FIG. 1A.
Figure 2A:
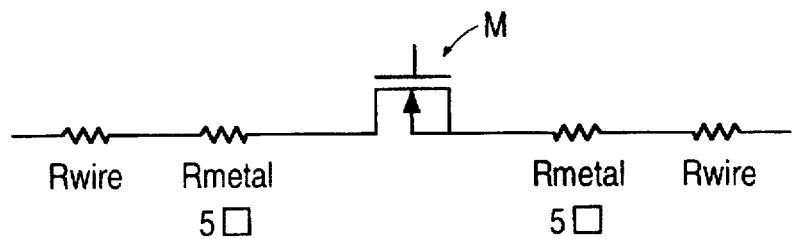
FIG. 2A illustrates an idealized model of a MOSFET having a bond wire resistance, a lumped metal finger resistance and a channel resistance.
Figure 2B:
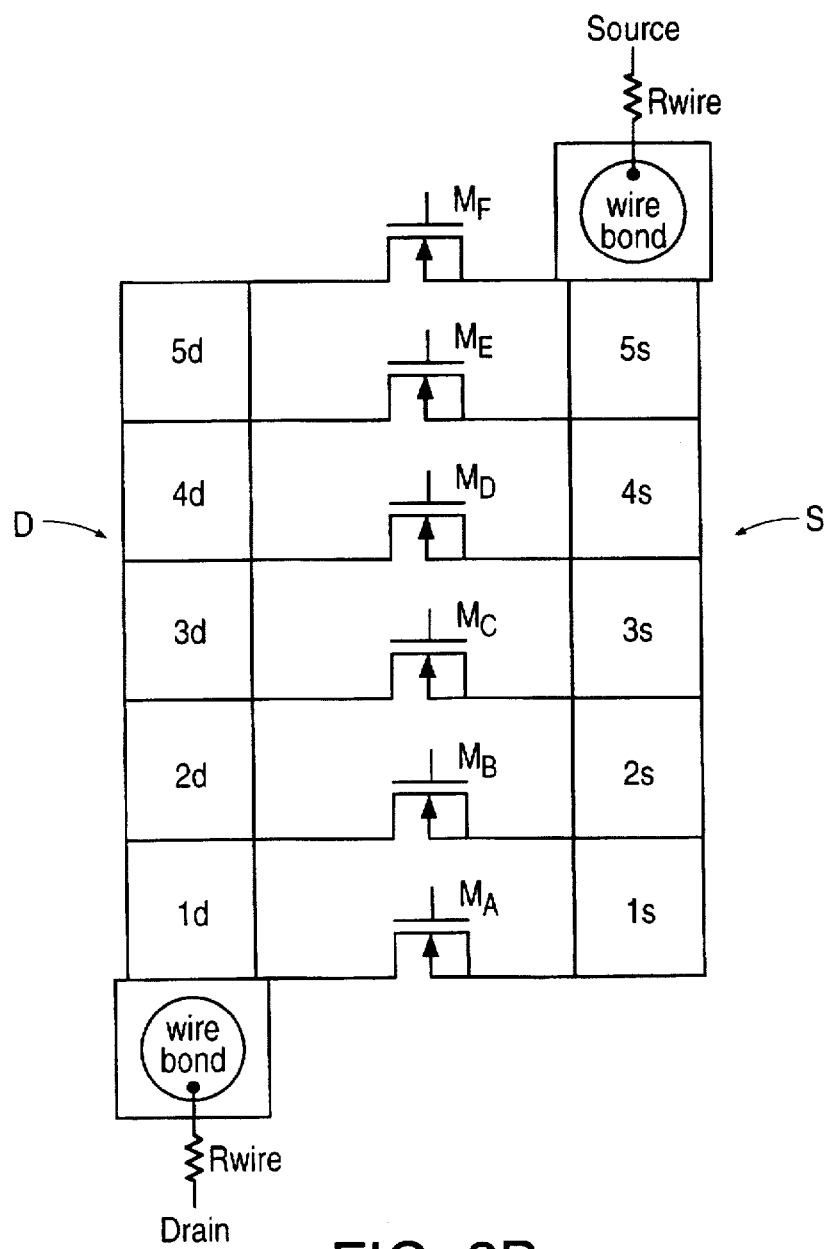
FIG. 2B illustrates a conventional arrangement of parallel MOSFETs connected between two conductive fingers.
Figure 2C:
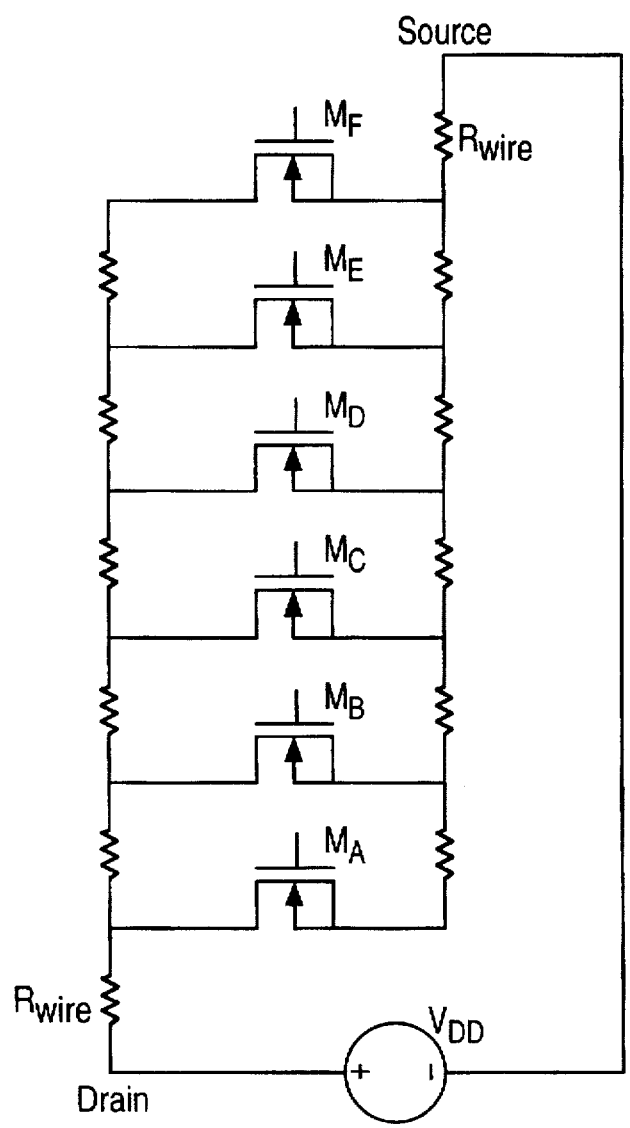
FIG. 2C is an equivalent circuit diagram of the arrangement shown in FIG. 2B.
Figure 3A:
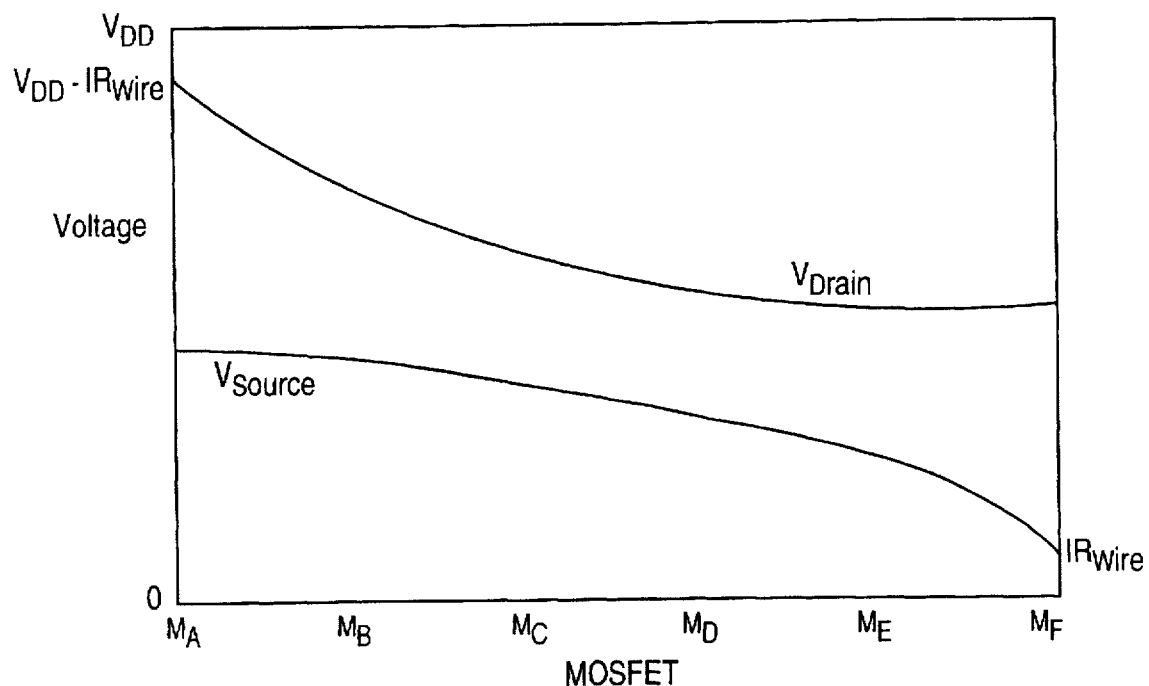
FIG. 3A is a graph showing the voltage along the conductive fingers illustrated in FIG. 2B.
Figure 3B:
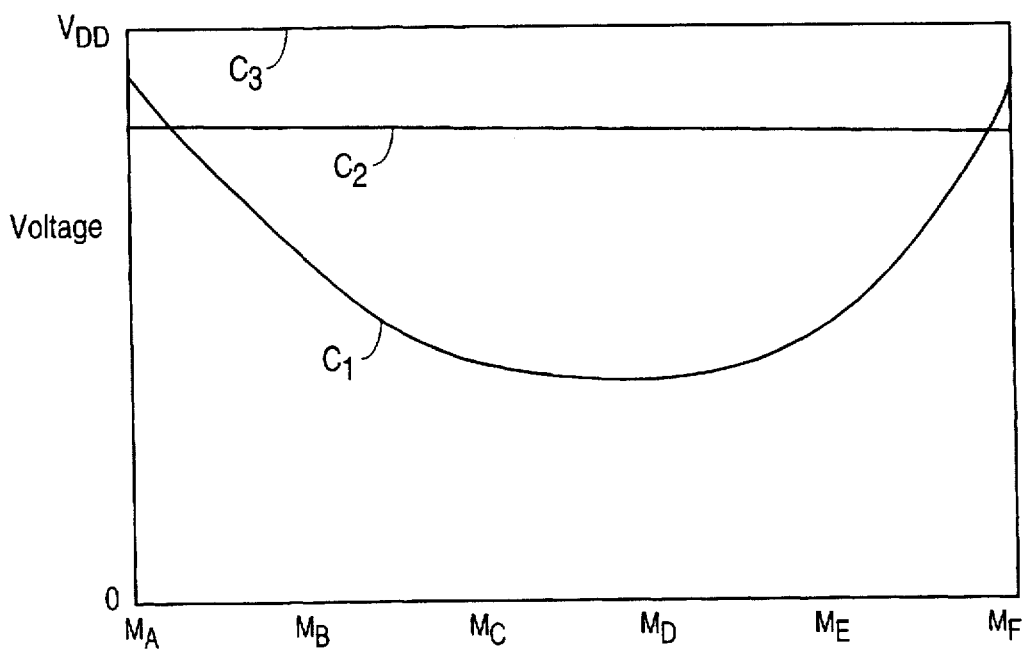
FIG. 3B is a graph illustrating the voltage across each of the MOSFETs shown in FIG. 2B, as compared with the voltage that would exist under a lumped resistance model and the voltage that would exist absent all parasitic resistances.
Figure 4:
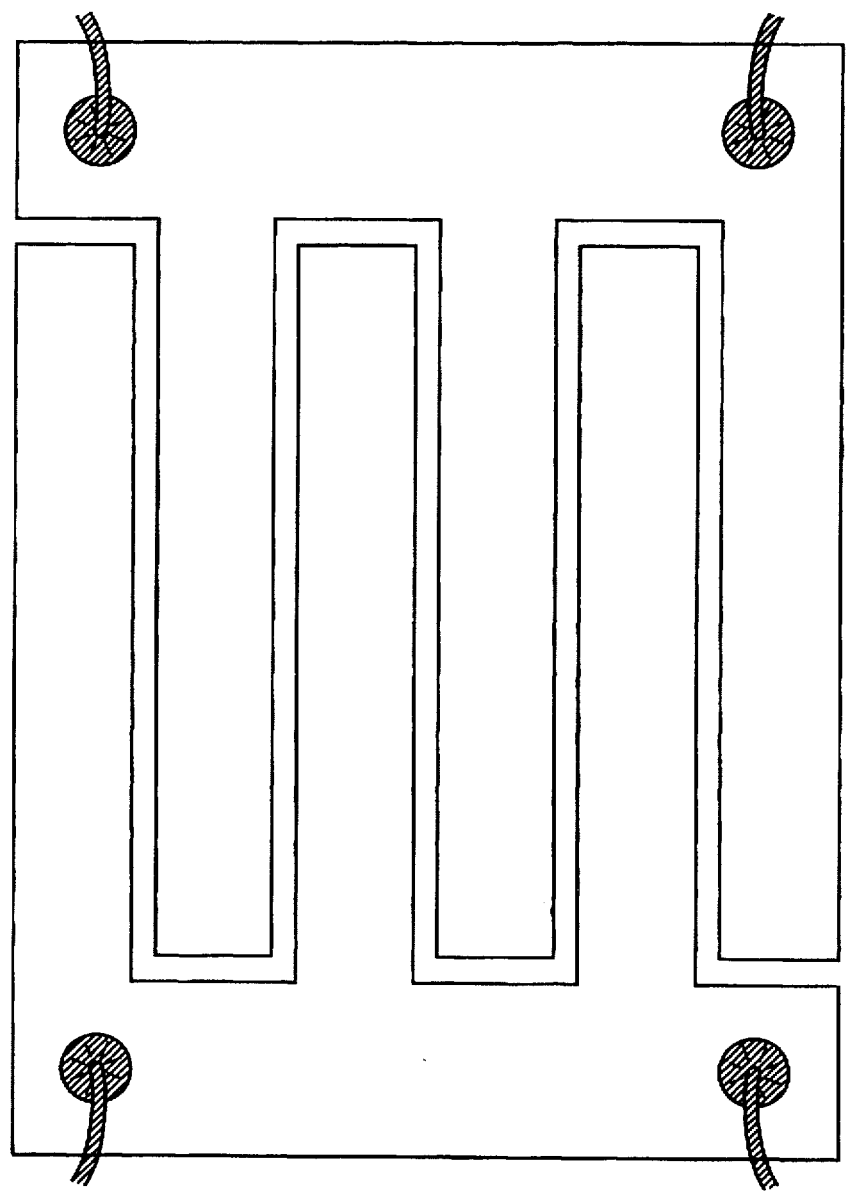
FIG. 4 illustrates an interdigitated arrangement of two buses.
Figure 6A:
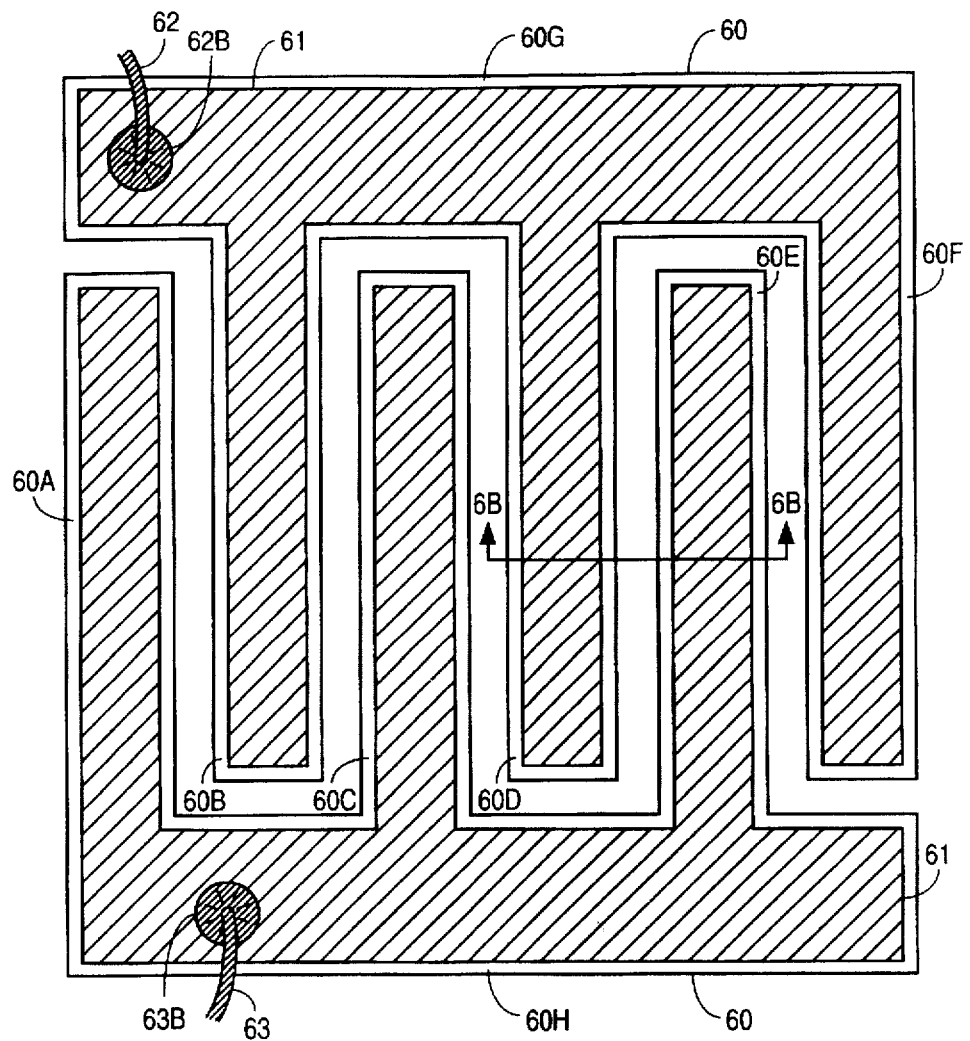
FIG. 6A illustrates a top view of a bus arrangement which includes a plurality of interdigitated fingers.

FIG. 6A illustrates a top view of a conductive metal layer 60 which is overlain by a metal strap layer 61. Metal layer 60 includes conductive lines 60A, 60C and 60E, which extend from a bus 60H, and conductive lines 60B, 60D and 60F, which extend from a bus 60G. Lines 60A–60F are arranged in the form of interdigitated fingers. Wires 62 and 63 are bonded to buses 60G and 60H, respectively, at bond locations 62B and 63B.

Figure 6B:
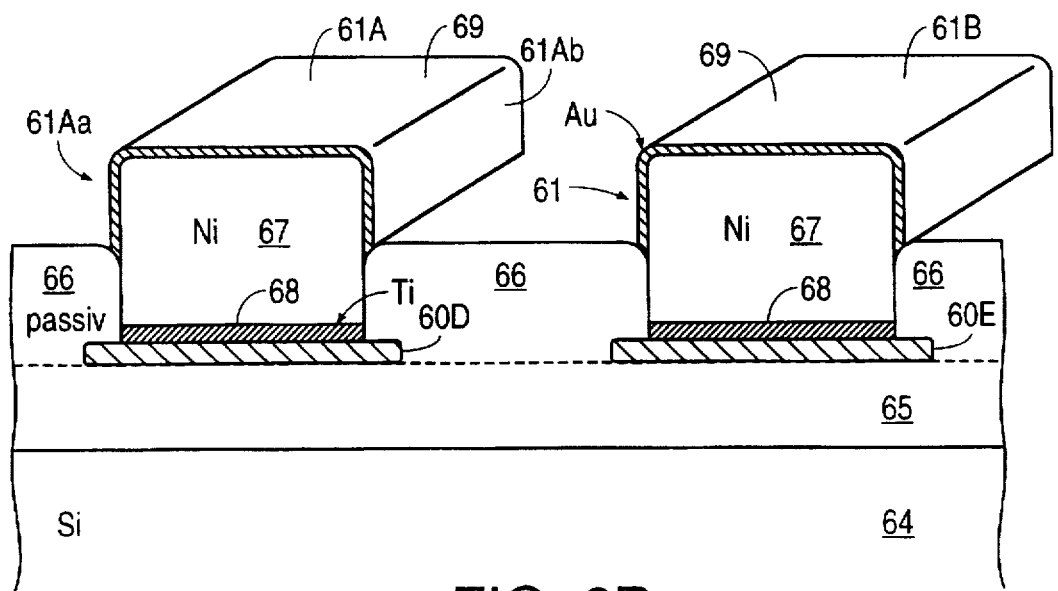
FIG. 6B illustrates a cross-sectional view of two of the adjacent fingers shown in FIG. 6A.

FIG. 6B illustrates a cross-sectional view of lines 60D and 60E taken at cross section 6B—6B shown in FIG. 6A. Underlying the structure is a silicon substrate 64 over which is formed an oxide layer 65. Metal layer 60, represented by lines 60D and 60E, is formed on top of oxide layer 65. A passivation layer 66 overlies oxide layer 65 and covers the edges of lines 60D and 60E. Metal strap layer 61 includes metal straps 61A and 61D, which overlie lines 60D and 60E, respectively. Metal strap layer 61 is not covered by passivation layer 66. Rather, passivation layer 66 abuts side edges 61Aa and 61Ab of strap 61A, for example. Straps 61A and 61B are formed in longitudinal channels in passivation layer 66. In this embodiment, metal strap layer 61 includes a nickel layer 67, a thin zinc layer 68 and a thin gold layer 69. Zinc layer 68 is deposited on top of lines 60D and 60E to improve the adhesion between metal layer 60 and nickel layer 67. Gold layer 69 is deposited on the top and side surfaces of nickel layer 67 to facilitate wire bonding.

In FIGS. 6A and 6B, metal layer 60 may be, for example, a second metal layer. The underlying first metal layer is not shown.

Figure 6C:
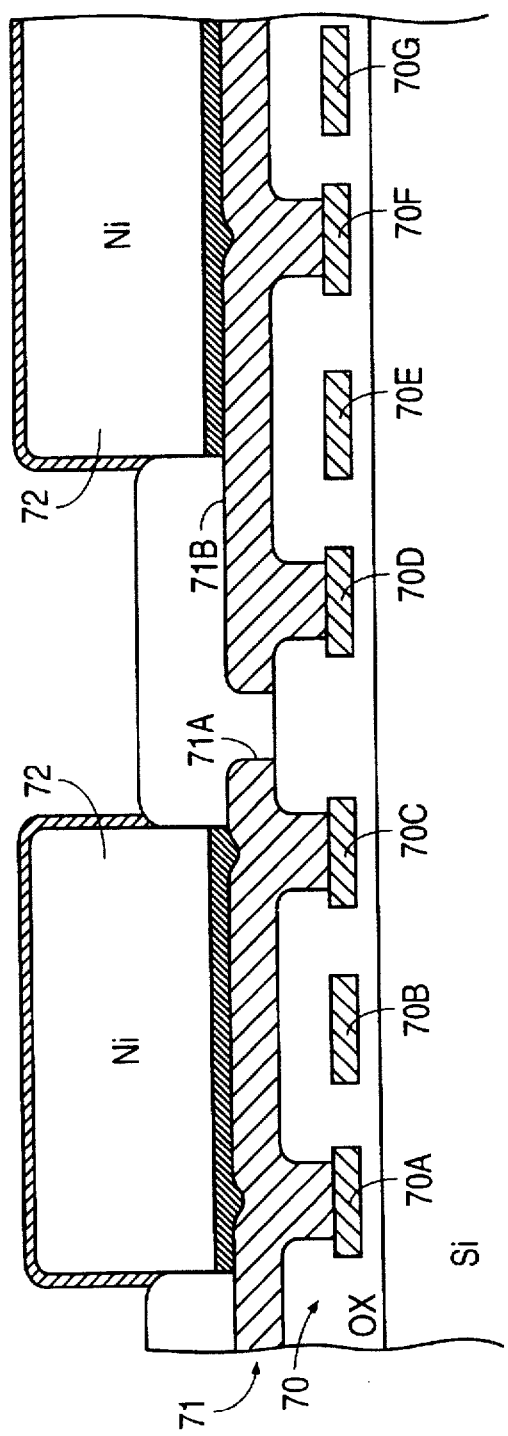
FIG. 6C illustrates an alternative arrangement including a first metal layer and a second metal layer to which a metal strap layer is applied.

FIG. 6C is a cross-sectional view showing a first metal layer 70 which includes conductive lines 70A–70G. Lines 70A–70G could be arranged in the manner of the diagonal buses shown in FIG. 5B, for example. Alternatively, the lines of the first metal layer could be arranged in an interdigitated comb-like pattern. A second metal layer 71 includes buses 71A and 71B. Vias connect bus 71A to lines 70A and 70C, and connect bus 71B to lines 70D and 70F. A metal strap layer 72 is plated on top of buses 71A and 71B. FIG. 6C illustrates how a relatively fine pitch in the lines of the first metal layer can be combined with a larger pitch in the buses of the second metal layer. Thus, structures according to this invention decouple the pitch of the first metal layer lines from the power busing rules entirely. The lines of the first metal layer have no design rules related to the metal straps of the second metal layer. Moreover, a thin second metal layer with tight line-to-line spacing can be used because the low-resistance is achieved by depositing the thick metal only where the second metal lines are drawn at a wide dimension.

The following is a description of a process for forming metal strap layer 61. The process begins after passivation layer 66 has been formed.

1. The same mask that is used to form the pad openings in passivation layer 66 is used to define the locations of metal straps 61A and 61B over lines 60D and 60E, respectively.

2. Passivation layer 66 is etched with a wet chemical or dry etchant to form longitudinal channels over lines 60D and 60E. For example, a reactive ion etch (RIE) may be used.

3. The exposed surfaces of lines 60D and 60E are degreased with tricholoroethane (TCA), and immediately before the following step, hydrofluoric acid (HF) is used to etch any oxide that has formed on the exposed surface.

4. A zincate solution is used to electrolessly plate a thin layer of zinc, and the zinc layer is etched back with sulfuric acid. This step may be repeated several times to form a smooth, uniform zinc layer. The result is zinc layer 68, which is preferably a monolayer.

5. Nickel layer 67 is plated electrolessly, using a hypophosphate nickel solution, to a target thickness (e.g., 12–25 µm).

6. The exposed surface of nickel layer 67 is rinsed with water.

7. The wafer is immersed in a gold solution to plate a thin gold layer 0.1 to 0.3 µm thick on nickel layer 67.

8. The gold layer is cleaned with hydrochloric acid.

9. Gold is plated on thin gold layer electrolessly using an autocatalytic cyanide /gold solution. The result is gold layer 69.

10. A final water rinse is performed. After die attach, wires are bonded to the exposed gold, preferably near the edge of the die. Gold or aluminum wires may be used.

Further information on this process is contained in Lawrence Durani, *Engineering Handbook*, 4th Ed., pg. 438, incorporated herein by reference.

In an alternative process, a thin layer of titanium is deposited after the passivation layer has been masked and etched. The titanium is then masked and etched into a feature size which is slightly larger than the openings formed in the passivation layer in step 2 above (i.e., the titanium layer slightly overlaps the passivation layer). Gold may be plated on the titanium layer or an intervening layer of nickel may first be deposited. The overlap protects metal layer 60 from damage resulting from later etching or other processing steps.

Figure 7:
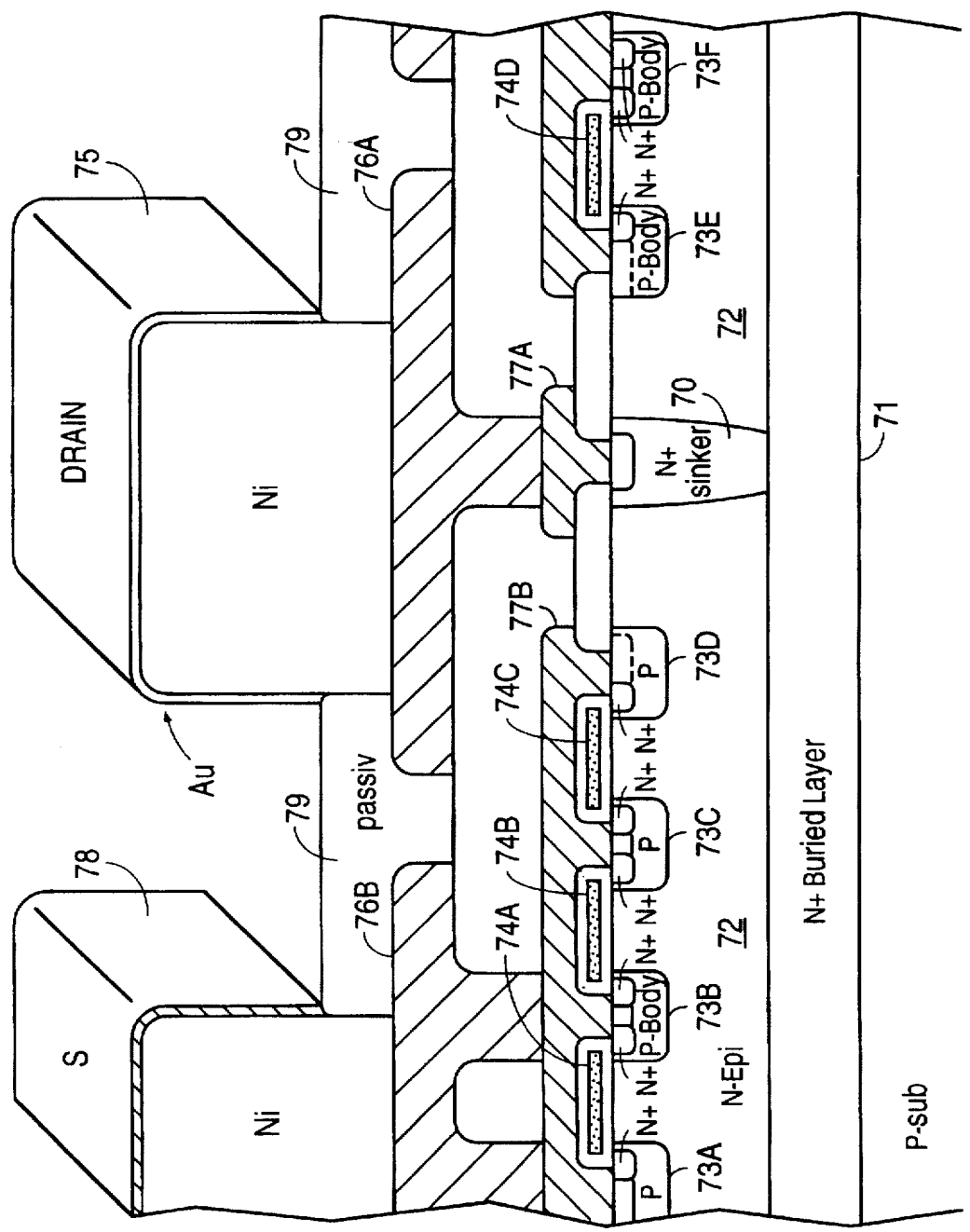
FIG. 7 illustrates a cross-sectional view of the use of metal straps in accordance with this invention in a quasi-vertical double-diffused MOSFET device.
Figure 8:
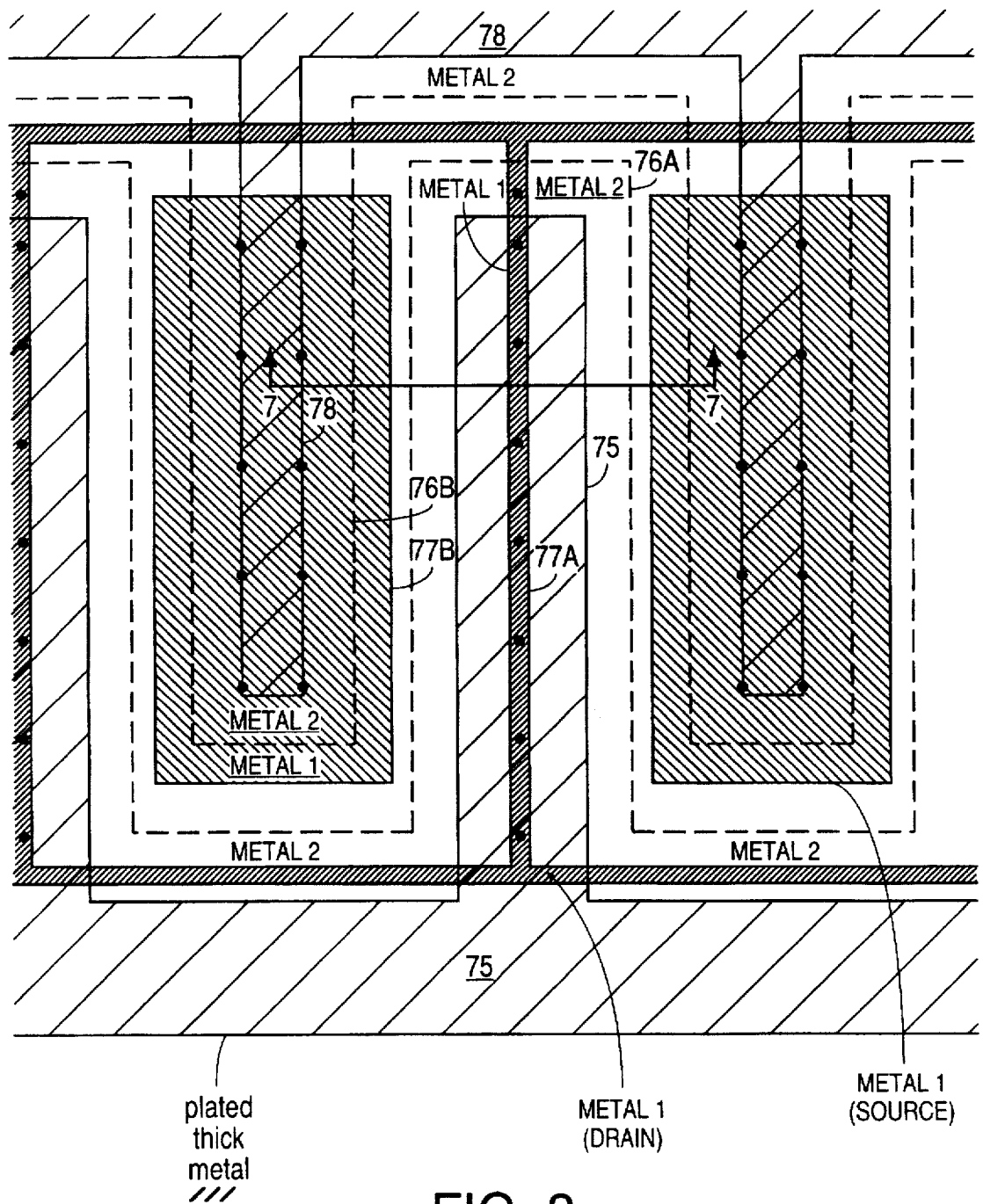

FIGS. 7 and 8 illustrate how a metal strap layer according to this invention may be used to minimize distributed resistance in a lateral power device. FIG. 7 is a view taken at cross-section 7—7 shown in the plan view of FIG. 8. FIG. 8 shows a drain metal strap 75 which is interdigitated with a source metal strap 78. Underlying drain metal strap 75 are a second metal bus 76A (hatched lines) and a first metal bus 77A. Underlying source metal strap 78 are a second metal bus 76B (hatched lines) and a first metal bus 77B. The dots in FIG. 8 represent vias between the first and second metal layers.

The structure of the lateral power device is shown in FIG. 7. Current flows from drain metal strap 75 through buses 76A and 77A, an N+ sinker 70, an N+ buried layer 71, an N epitaxial region 72, and then through channel regions in each of P body regions 73A–73F. Conduction in the channel regions is controlled by gate 74A–74D. Current leaves the channel regions in P body regions 73A–73F and flows through N+ regions (not numbered) and buses 77B and 76B to source metal strap 78, which is in contact with bus 76B. Buses 77A and 77B are part of a first metal layer, and buses 76A and 76B are part of a second metal layer. This is a "quasi-vertical" or "up-drain quasi-vertical" DMOS device, common in 60 V power ICs. In quasi-vertical devices, while current flows vertically into the buried layer and eventually back to the surface, the busing of the current on the top surface is entirely lateral. In this sense, a quasi-vertical power MOSFET is a "laterall" device.

The second metal layer (buses 76A and 76B) is connected to the first metal layer (buses 77A and 77B) through vias in the interlayer dielectric. The first metal layer includes relatively wide buses similar to bus 77B, which connect to the source/body regions of the MOSFET (P body regions 73A–73F) and relatively narrow buses similar to bus 77A, which connect to the drain (N+ sinker 70 and buried layer 71), whereas the pitch of the second metal layer (buses 76A and 76B) is more evenly divided between the source and drain lines. A passivation layer 79 is deposited on the second metal layer, except for channels down the center of buses 76A and 76B, and then metal straps 75 and 78 are deposited, as described above, including layers of zinc, nickel and gold.

Figure 9A:
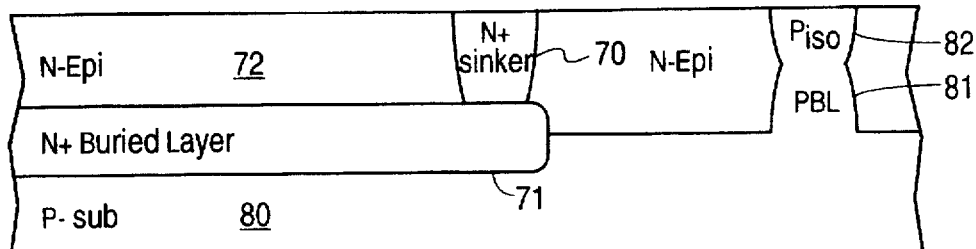
FIGS. 9A–9D illustrate steps in a process which may be used to fabricate a device of the kind illustrated in FIGS. 7 and 8.

FIGS. 9A–9D illustrate a sequence of processing steps which yield a device similar to the device illustrated in FIGS. 7 and 8. As shown in FIG. 9A, a P-type substrate 80 is implanted with boron ions at a dose of about $5 \times 10^{14}$ cm$^{-2}$ to form a P+ region where P buried layer 81 is to be located, and with a similar implant of antimony to form an N+ region where N+ buried layer 71 is to be located. P substrate 80 may have a resistivity of, for example, 4 ohm-cm. N-type epitaxial layer 72 is grown on the top surface of substrate 80, having a resistivity of from 0.3 to 10 ohm-cm and a thickness of from 2 to 15 µm. Preferably, the resistivity of N-epitaxial layer 72 is around 2 ohm-cm and its thickness is from 5 to 8 µm. A heavily doped P+ sinker and a heavily doped N+ sinker are then formed and diffused to overlap the up-diffusing P+ and N+ regions, respectively, to form N+ buried layer 71 and N+ sinker 70 as well as a P buried layer 81 and a P isolation region 82. In other areas (not shown) a P-type well diffusion and a thick LOCOS field oxide may be formed to facilitate fabrication of conventional CMOS devices.

Figure 9B:
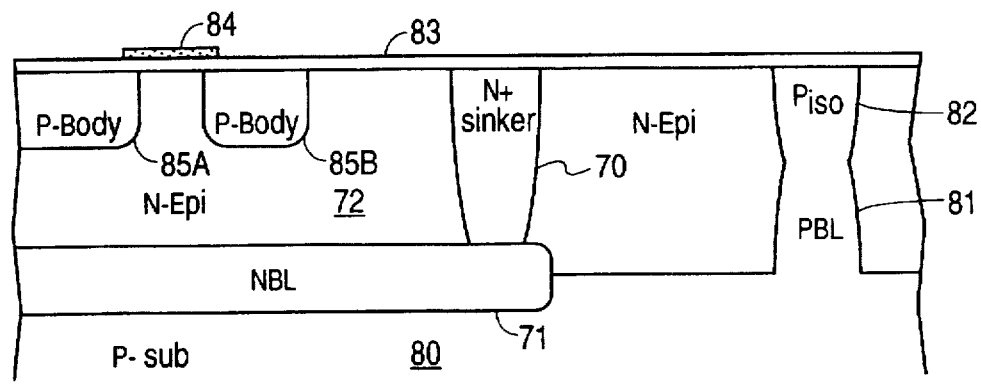

As shown in FIG. 9B, a gate oxidation layer 83 is formed and a layer of polysilicon is deposited, doped and etched to form a polysilicon gate 84. P-body regions 85A and 85B are then implanted (for example, at a dose of from 1 to $10 \times 10^{13}$ cm$^{-2}$ boron) and diffused to a depth of from 0.9 to 4 µm. P-body regions 85A and 85B are self-aligned with gate 84. P-body regions 85A and 85B can be in the form of individual islands surrounded by gate 84 or in the form of long stripes on either side of gate 84.

Figure 9C:
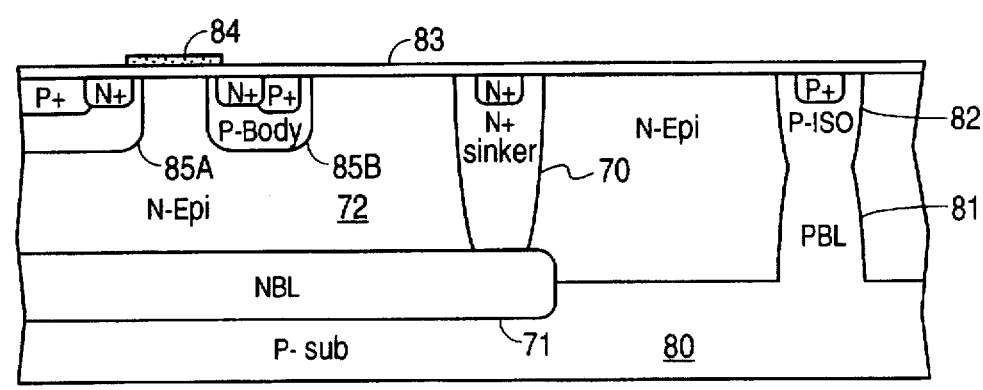

Next, as shown in FIG. 9C, N+ and P+ implants are introduced through a mask, at dosages of $5 \times 10^{15}$ cm$^{-2}$ and $9 \times 10^{13}$ cm$^{-2}$, respectively, to form P+ and N+ contact regions.

Figure 9D:
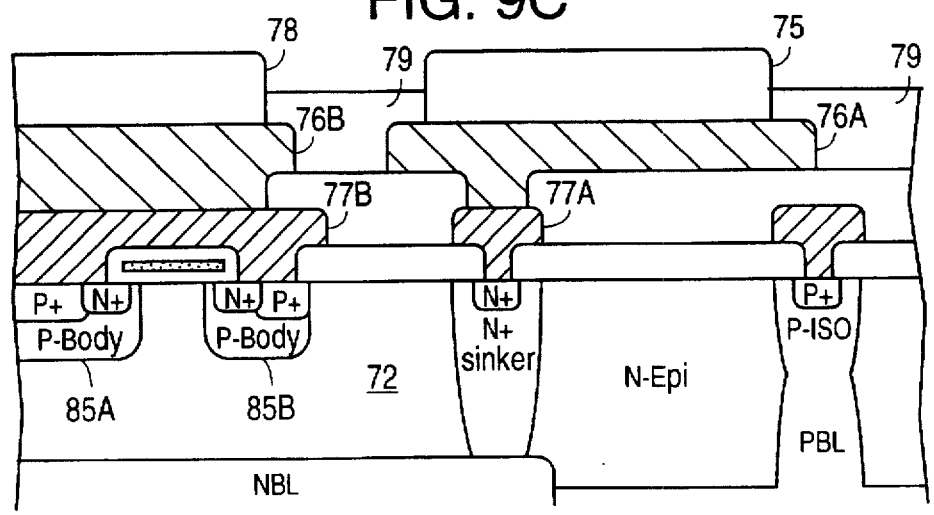

As shown in FIG. 9D, surface oxide layers are then masked and etched to form contacts to the N+ drain and the N+/P+ source/body regions. Aluminum-copper-silicon (for example, 96%, 2%, 2%) is then sputtered, masked and etched to form buses 77A and 77B. After deposition of an interlayer dielectric formed of a material such as LTO (low temperature oxide) glass, vias are opened to buses 77A and 77B, and a second metal layer including buses 76A and 76B is deposited to a thickness from 0.6 to 4 µm, with a thickness of 0.8 to 1 µm being preferred. Nitride or glass passivation layer 79 is then deposited and masked to form channels where metal straps 75 and 78 may be formed.

Figure 10A:
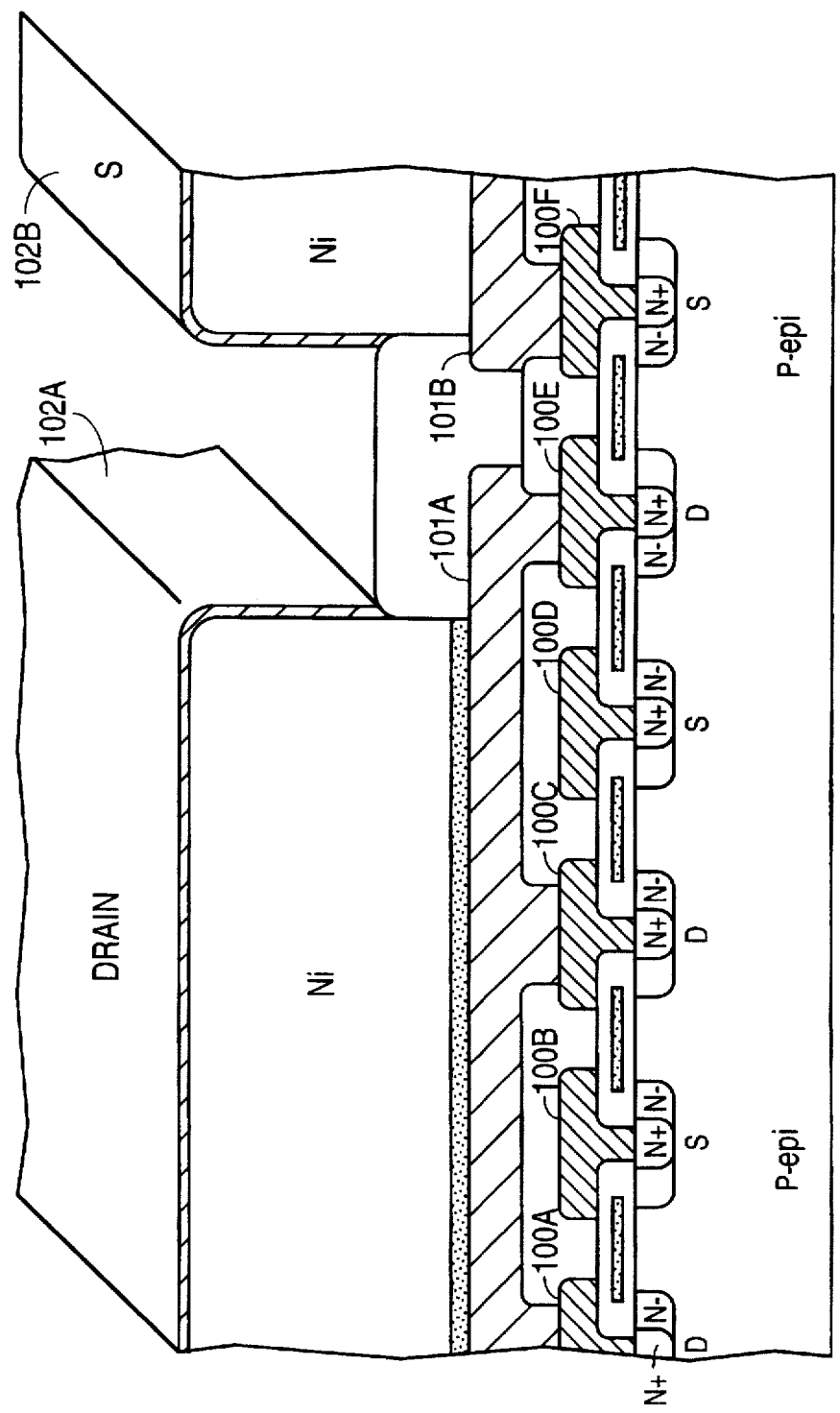
FIG. 10A illustrates a cross-sectional view of a closed-cell lateral device including metal straps in accordance with this invention.

FIGS. 10A–10E illustrate how this invention may be applied to a closed-cell lateral device of the kind illustrated in FIGS. 5A–5C. FIG. 10A illustrates a modified cross-sectional view of the alternating source and drain cells, with each cell having a lightly doped (N−) region to limit field strength at the P-N junction. The cells are formed in a P epitaxial layer. A first metal layer includes lines 100A–100F, which are arranged diagonally as shown in the broken-away top view of FIG. 10B. The second metal layer includes a drain bus 101A and a source bus 101B. The second metal layer includes other source and drain buses which are interdigitated in the manner shown in FIG. 10B.

FIG. 10A is "modified" in that the vias between the buses 101A and 101B and the lines 100A–100F are shown as being in the same cross-sectional plane as the metal contacts from the lines 100A–100F to the individual source and drain regions. As shown in FIG. B, wherein the vias between the buses 101A and 101B and the lines 100A–100F are shaded, this is not the case. This is made even clearer in the detailed top view of FIG. 10C, and in the detailed cross-section views shown in FIGS. 10D and 10E, which are taken at cross sections 10D–10D and 10E–10E, respectively, shown in FIG. 10C.

In contact with the top surface of buses 101A and 101B are metal straps 102A and 102B in accordance with this invention. With this arrangement, the resistance between any point on buses 102A and 102B and any other point on the same bus (e.g., a bonding wire connection) is very low.

Figure 10B:
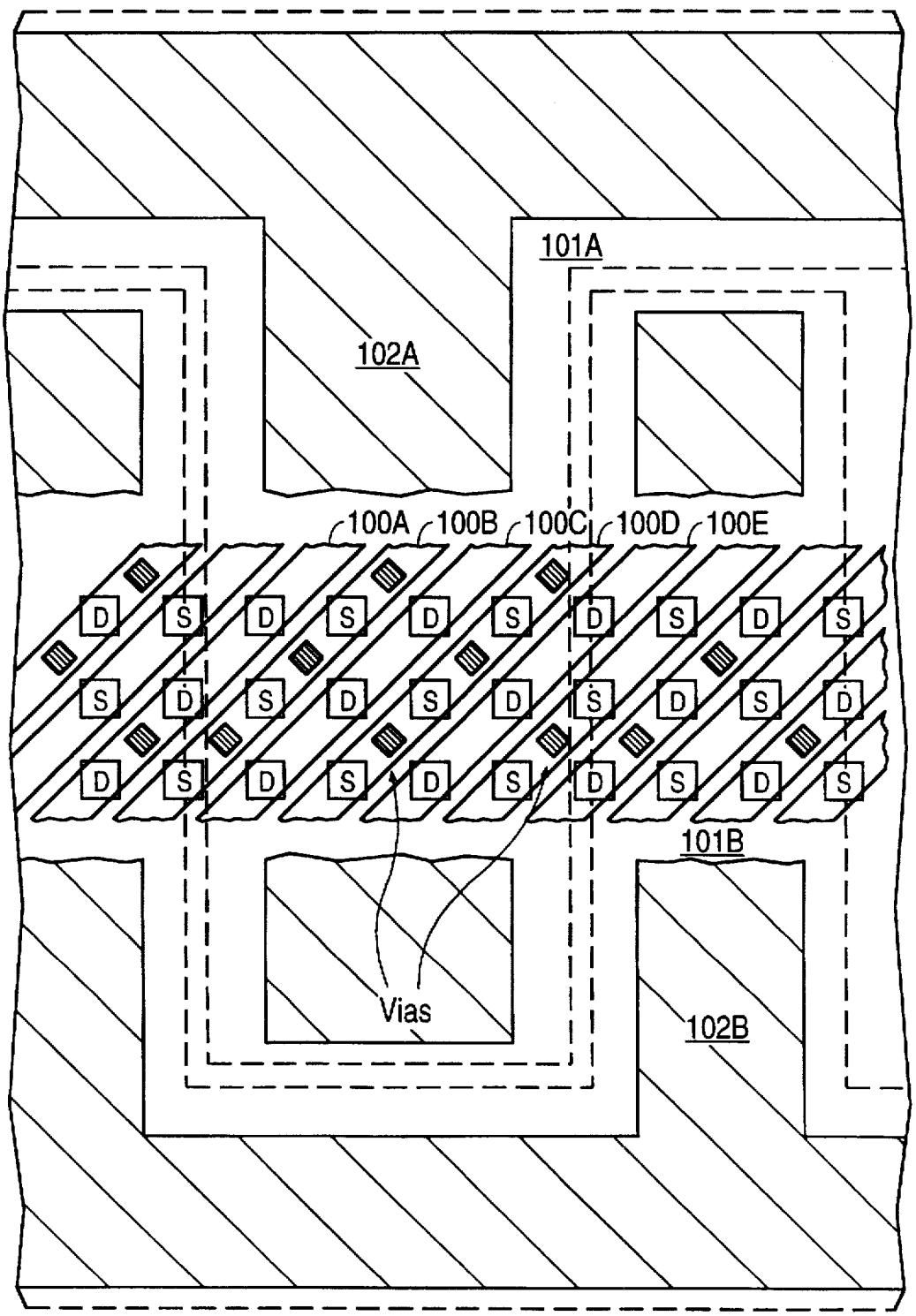
FIG. 10B illustrates a top view of a device similar to that shown in FIG. 10A.
Figure 10C:
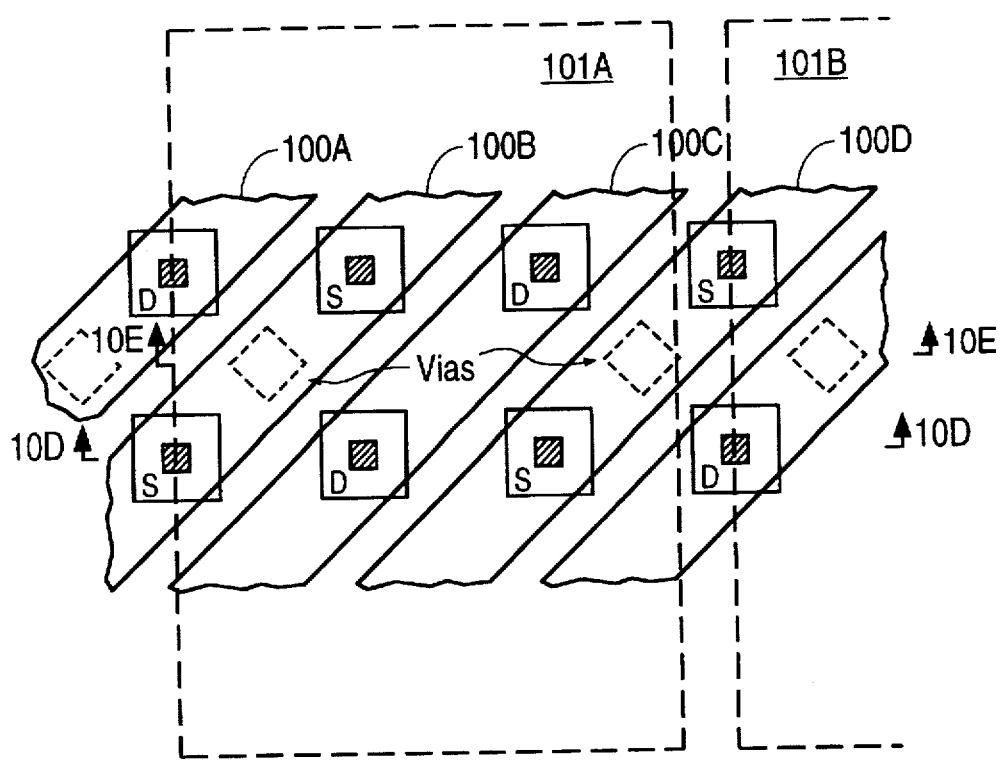
FIGS. 10C–10E illustrate detailed views of the closed-cell lateral device shown in FIGS. 10A and 10B.
Figure 10D:
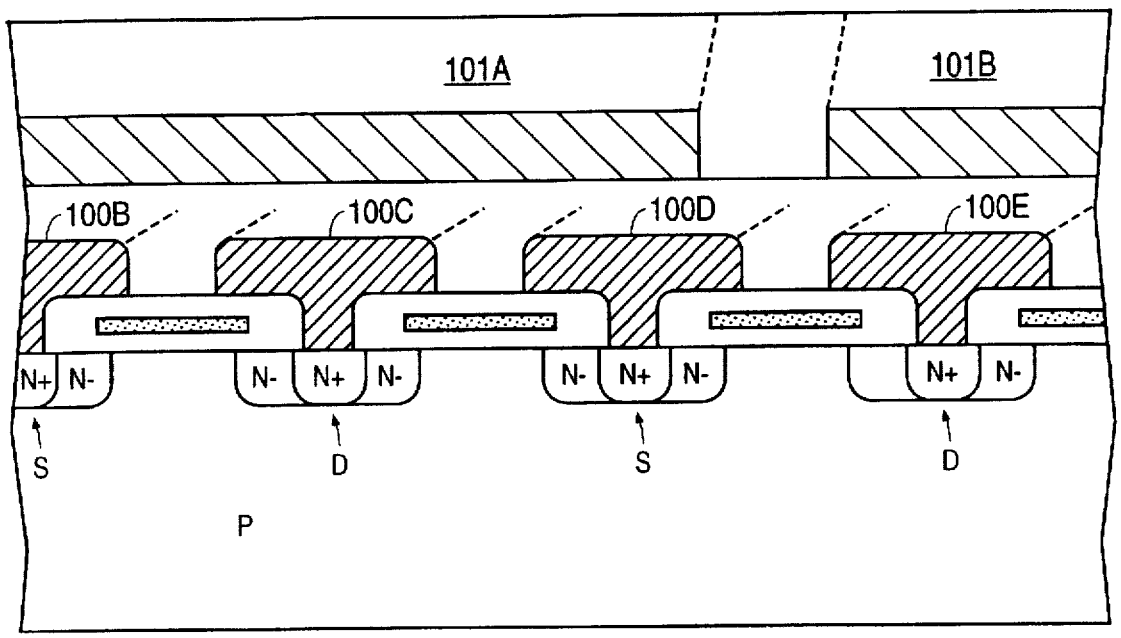
Figure 10E:
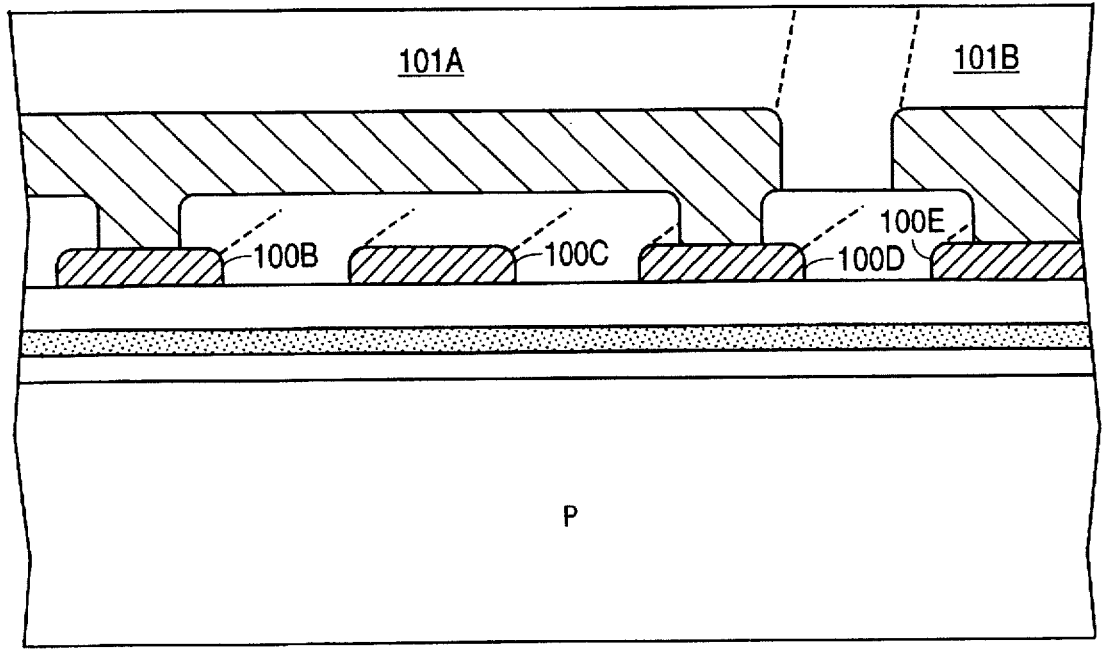

FIGS. 11A–11D illustrate the fabrication of two devices of the kind shown in FIGS. 10A and 10B, one device being an N-channel device and the other device being a P-channel device. In the cross-sectional views of FIGS. 10A and 10B, the P-channel device is fabricated within an N-well region while the N-channel device is fabricated within a P-epitaxial layer in which a P-well may optionally be included.

Figure 11A:
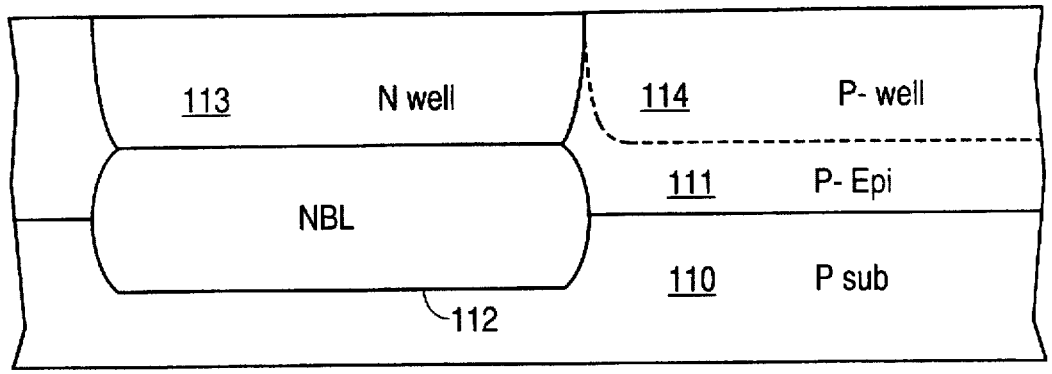
FIGS. 11A–11D illustrate steps in a process of fabricating a device of the kind shown in FIGS. 10A and 10B.

The process begins with a P-type substrate 110 (resistivity 2 to 20 ohm-cm) in which N-type dopant is implanted at a dosage of 1 to $5 \times 10^{15}$ cm$^{-2}$. A P-type epitaxial layer 111 is then grown on the top surface of P substrate 110, and by diffusion an N buried layer 112 is formed at the junction between P substrate 110 and P epitaxial layer 111. N-type dopant is then implanted in the top surface of P epitaxial layer 111 to form an N well 113 for the P-channel device. A P well 114 may be formed similarly by implanting P-type dopant. The resulting structure is shown in FIG. 11A for the N-channel device.

Figure 11B:
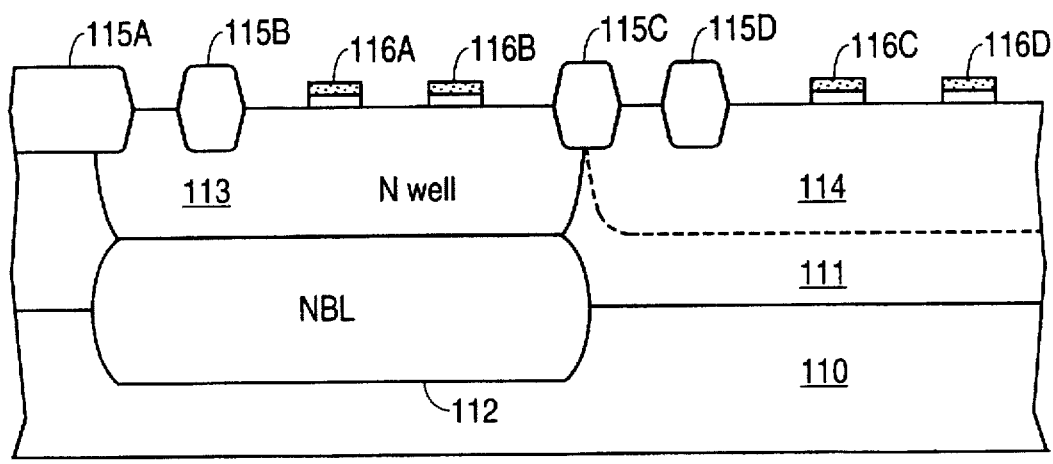

As shown in FIG. 11B, LOCOS oxide regions 115A–115D are formed at the top surface of P epitaxial layer 111. Next, a gate oxide layer from 100 to 2000 Å thick (preferably 175 to 400 Å thick) is grown. A polysilicon layer is deposited, doped and etched to form gates 116A–116D.

Figure 11C:
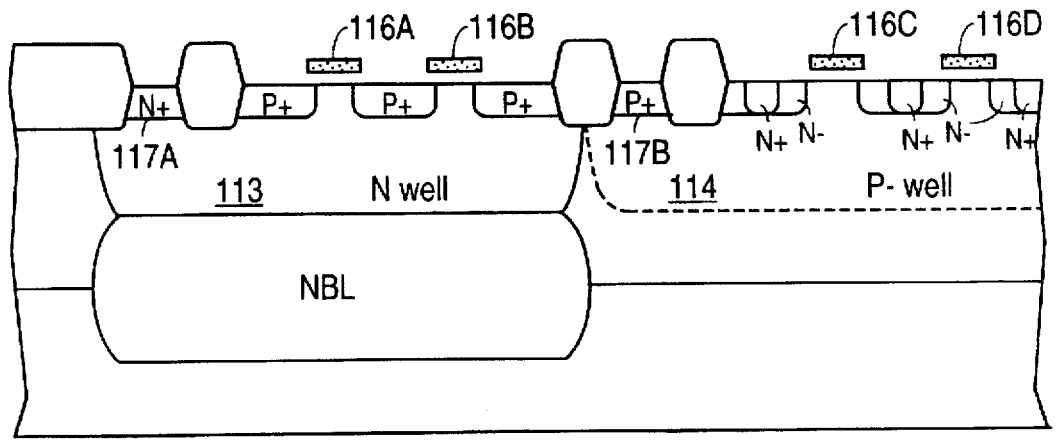

As shown in FIG. 11C, P+ regions and N+ regions are implanted in N well 113 and P well 114, respectively. The P+ regions in N well 113 are self aligned with gates 116A and 116B and form the source and drain diffusions for the power PMOS device. In P well 114 a photoresist mask is used to hold the N+ regions 1 to 2 µm back from gates 116C and 116D, and a blanket N− drift implant forms a lightly doped drain (LDD) arrangement, the composite structure of the N+ and N− regions forming the source and drain diffusions of the power NMOS device. Alternatively, the N+ region may abut the polysilicon gate thereby eliminating the drift (N−) region. In another version, the N-drift implant can precede formation of an oxide sidewall spacer on the polysilicon gate. The N+ implantation is then held away from the gate by the sidewall oxide, forming a 0.25 µm drift length on both the source and drain. An N+ contact region 117A is formed in N well 113 and a P+ contact region 117B is formed in P well 114.

Figure 11D:
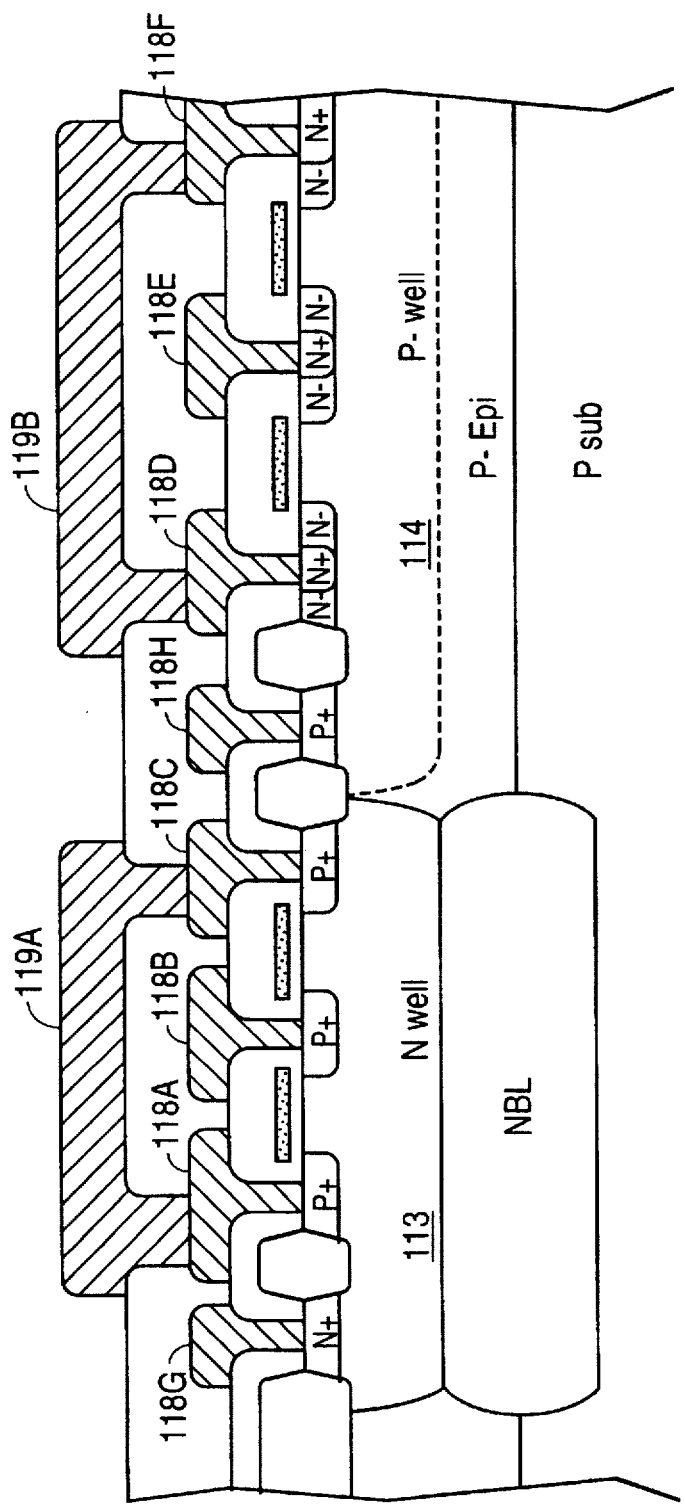

FIG. 11D shows a first metal layer including diagonal buses 118A–118F, each of which is connected through a via to one of the P+ or drifted N+ regions. An additional diagonal bus 118G is connected to the N+ contact region in N well 113, and an additional diagonal bus 118H is connected to the P+ contact region in P well 114.

The second metal layer includes buses 119A and 119B, which are interdigitated as shown in FIG. 10B. If the full extent of the PMOS and NMOS devices were shown, a second bus in the second metal layer would be shown connected to line 118B in the PMOS device; similarly, a second bus in the second metal layer would be shown connected to line 118E in the NMOS device. Metal straps (not shown in FIG. 11D) are then plated on the top surface of buses 119A and 119B.

Figure 12:
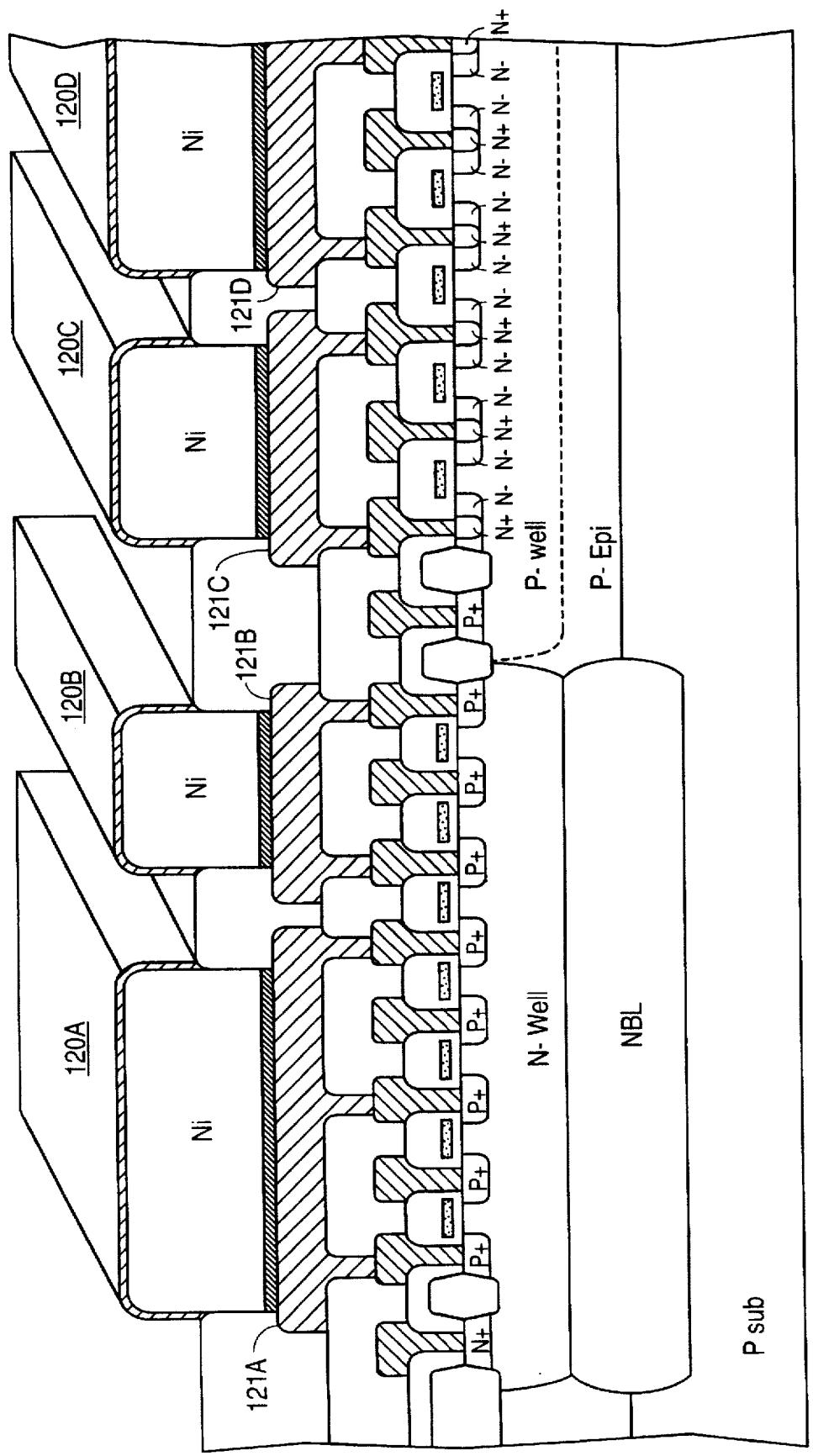
FIG. 12 illustrates a cross-sectional view of a device similar to the devices shown in FIGS. 10A and 10B, but having a greater number of cells in each well.

FIG. 12 illustrates a cross-sectional view of a similar complementary pair of devices, having a greater number of cells in each well, showing metal straps 120A–120D plated on the top of buses 121A–121D, respectively.

Figure 13A:
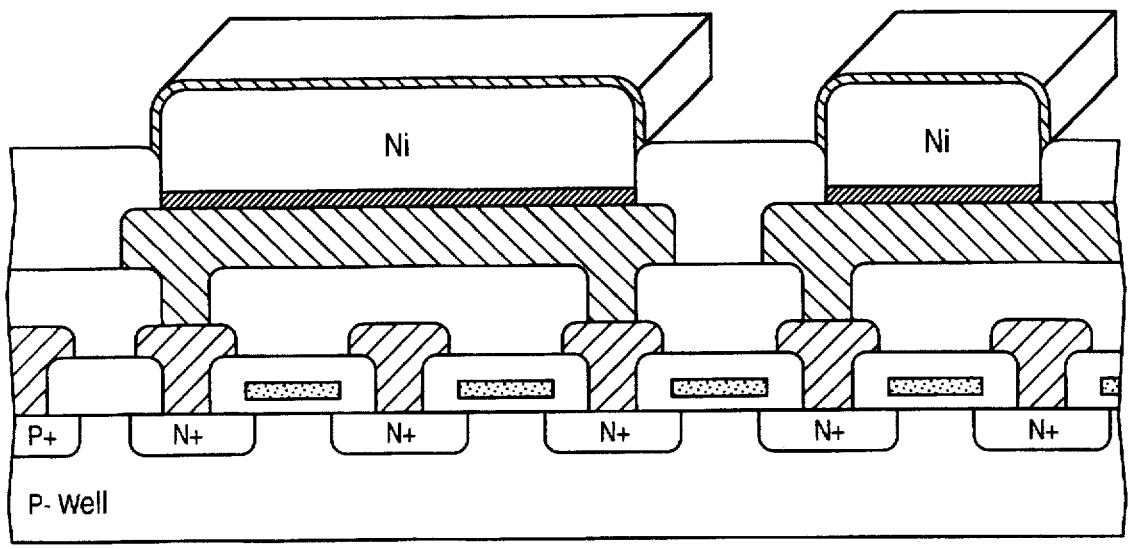
FIG. 13A illustrates a conventional NMOS device including a metal strap of the invention.
Figure 13B:
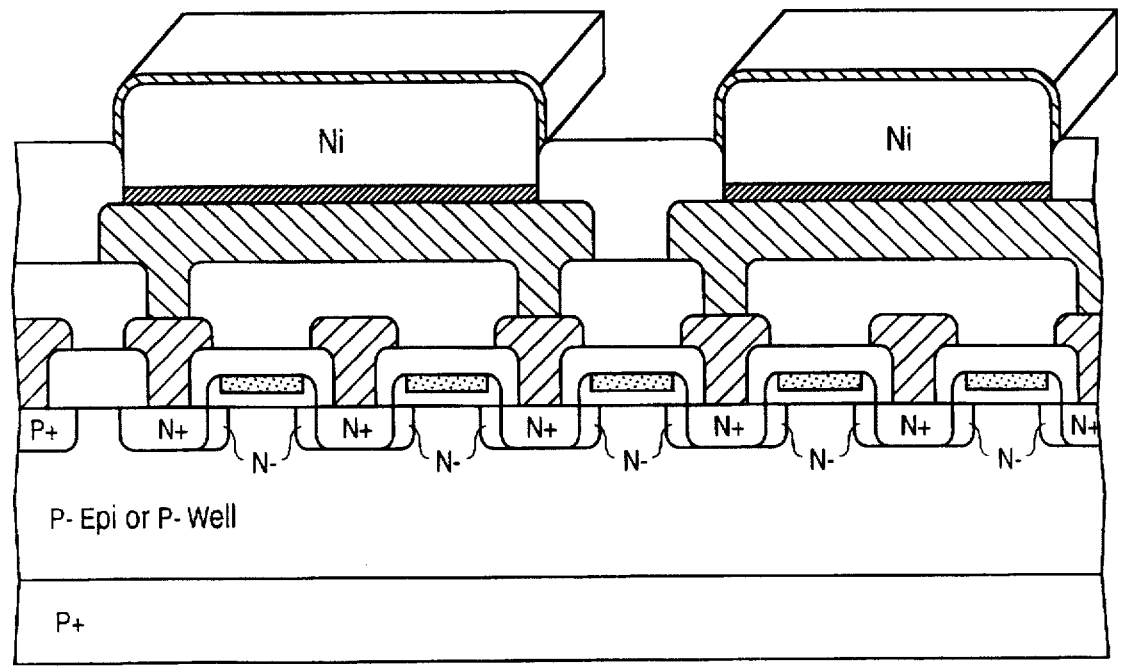
FIG. 13B illustrates a device similar to that shown in FIG. 13A except that N-type drift regions have been formed adjacent the N+ regions in each cell of the device.
Figure 13C:
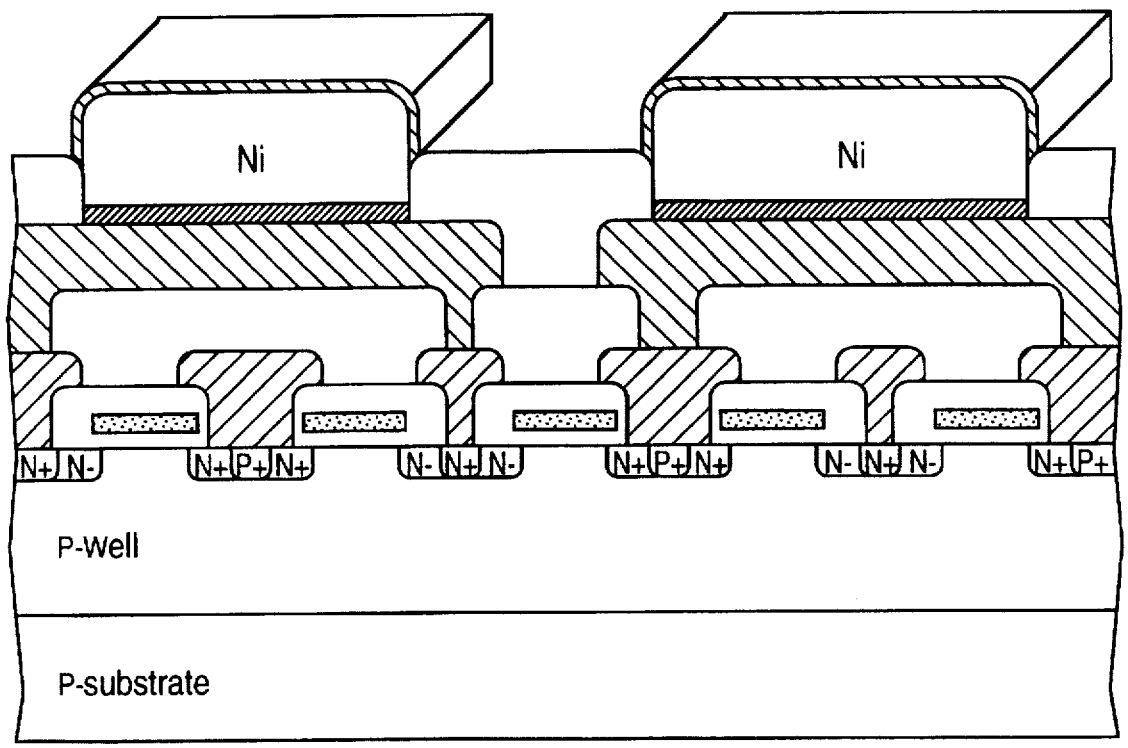
FIG. 13C illustrates a power NMOS device which has a source-body short in each of the source cells.
Figure 13D:
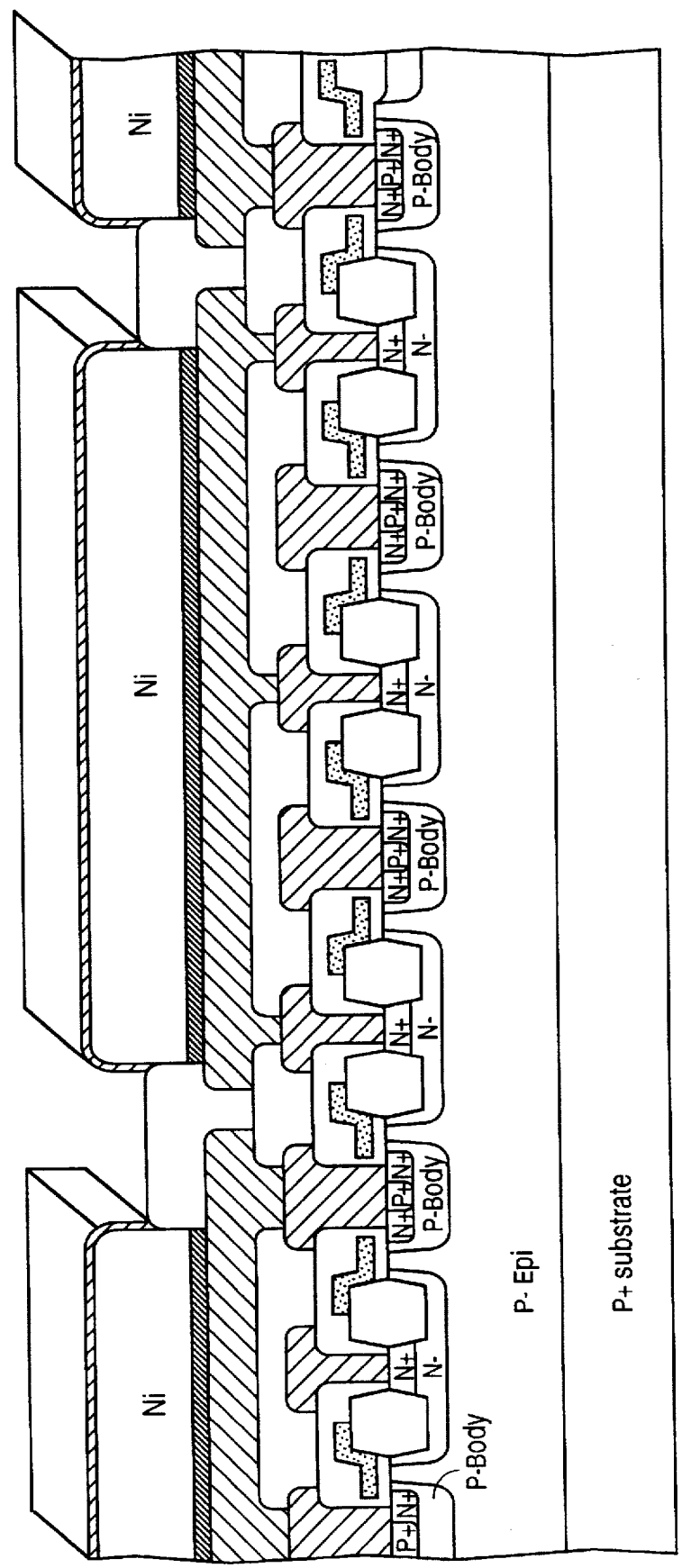
FIG. 13D illustrates a lateral device including a double-diffused P body region and an N-drift region.
Figure 13E:
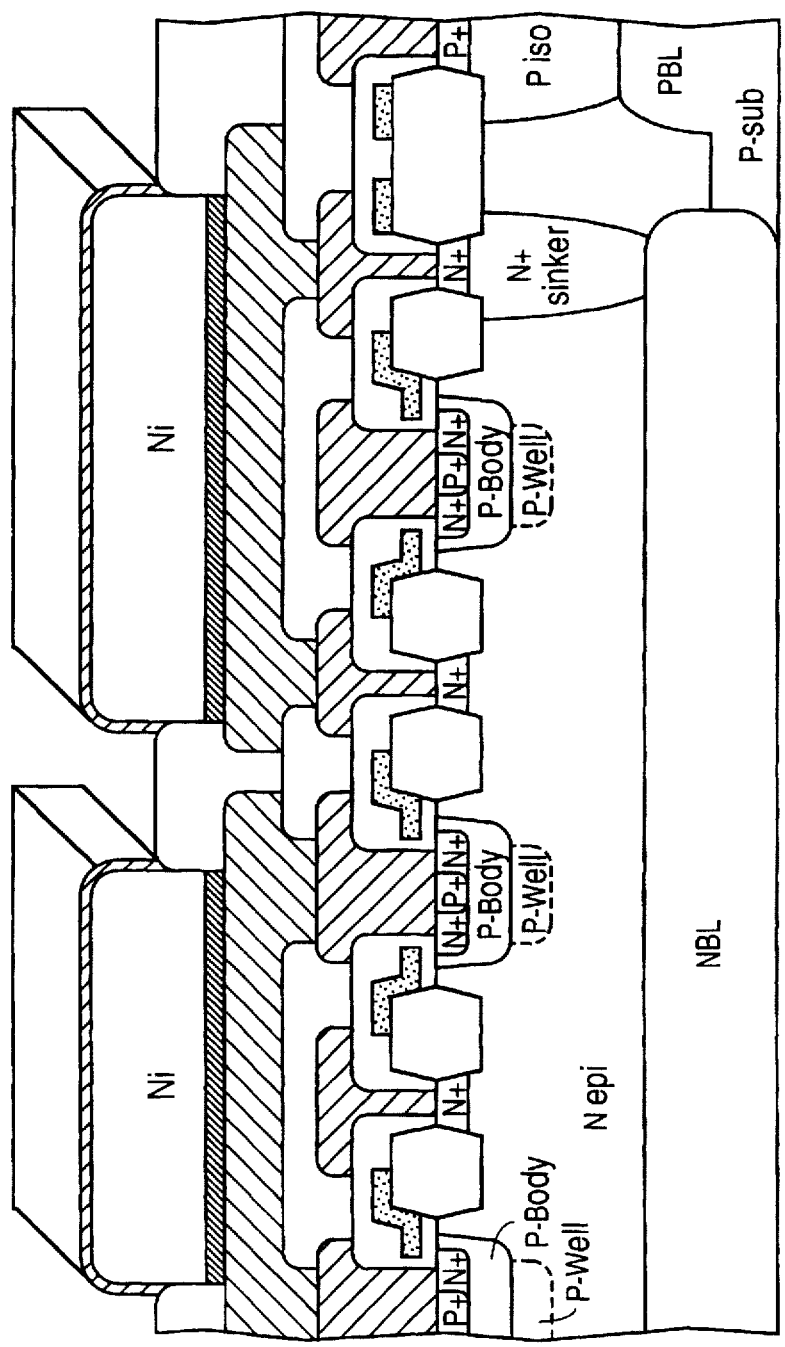
FIG. 13E illustrates a lateral device equivalent to the quasi-vertical device shown in FIG. 7.

FIGS. 13A–13E illustrate other devices to which the principles of this invention may be applied. FIG. 13A shows a conventional NMOS device constructed in a P well. The device shown in FIG. 13B is similar, but sidewall spacers have been used to form short (e.g., 0.2 µm) lightly doped N-type drift regions adjacent the N+ regions. The formation and purpose of lightly doped drains (LDDs) are described in Wolf, *Silicon Processing For The VLSI Era*, Vol. 2, Lattice Press (1990), pp. 354–360, incorporated herein by reference. FIG. 13C illustrates a power NMOS device which has a N+/P+ source/body short in each of the source cells. FIG. 13D illustrates a lateral device formed in a P-type epitaxial layer, where the double-diffused P body region is used to prevent channel punchthrough and an implanted N-drift region is optimized for some voltage, e.g., 60 V. Finally, FIG. 13E is the lateral equivalent of the quasi-vertical device shown in FIG. 7.

Figure 15:
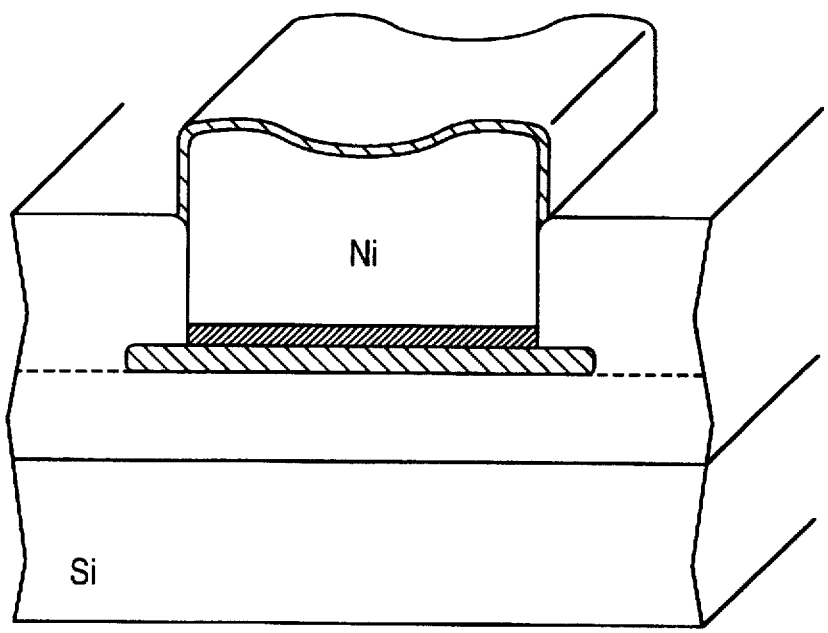
FIG. 15 illustrates a cross-sectional view of a relatively wide, saddle-shaped metal strap.
Figure 16:
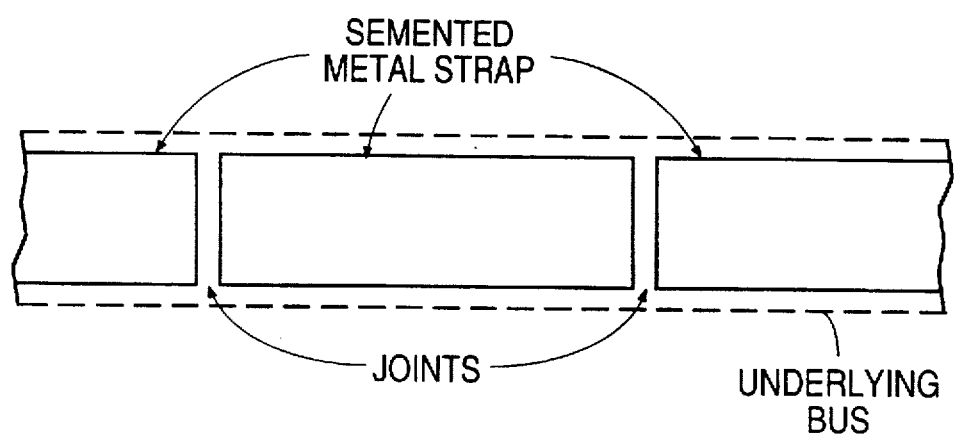
FIG. 16 illustrates a segmented metal strap.

If the metal strap layer is made too wide, it may tend to form in a "saddle" shape, as shown in FIG. 15, because the electroplating solution near the center of the strap tends to become depleted of metal ions. This problem can be alleviated by limiting the width of the strap to about 25 µm or less. Alternatively, the strap can be formed in longitudinal segments, as shown in the top view of FIG. 16, which allows the metal ions to gain access to the central portion of the strap through the "joints" between the segments. While the resistance of the bus increases slightly if this technique is used, the overall distributed resistance is still much less than it would be absent a metal strap layer. Moreover, segmenting the metal strap has the added benefit of reducing stress due to dissimilar temperature coefficients of expansion between the thick metal and the underlying silicon.

Figure 14:
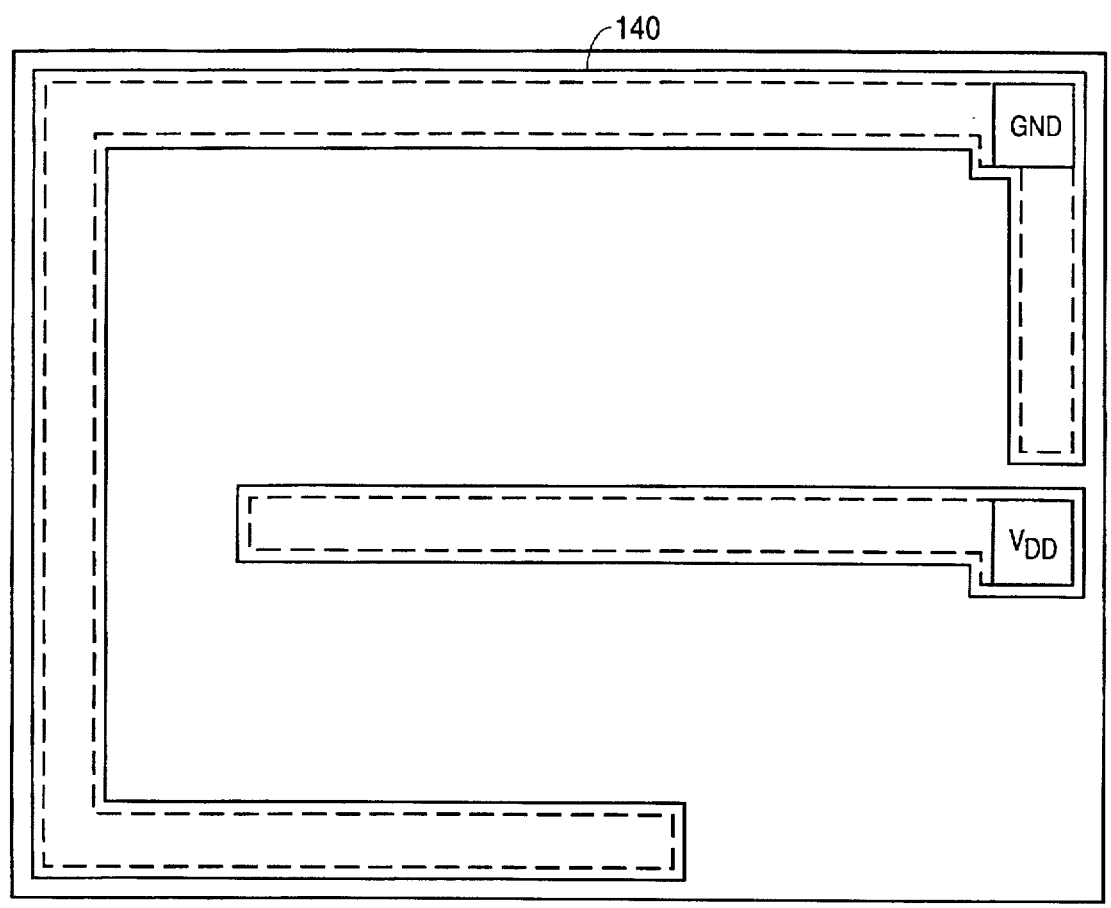
FIG. 14 illustrates a non-power IC having metal straps over the ground and voltage supply ($V_{DD}$) buses.

The technique of this invention, using a metal strap layer and conventional wire bonds, is applicable to other types of lateral power devices. Moreover, the technique is not limited to power devices. The main bus in an IC may also benefit from a low distributed resistance. For example, in the IC shown in FIG. 14, the ground bus 140 may have over 30 squares of resistance associated with it. For a 1 μm thick second metal layer with 30 Ω/sq., this resistance amounts to nearly 1 ohm. Using a 30 μm thick nickel and 1 μm gold plated bus, this resistance falls to around 1.8 mΩ/sq. or a total resistance of only 60 μm Ω. The reduced resistance improves efficiency, reduces the risk of CMOS latch-up, reduces "ground bounce" (i.e., a change in the voltage along the length of a ground bus line as current in the bus line changes during normal operation) and improves the switching waveforms of high current buffer outputs.

While this invention has been described with reference to specific embodiments, it is understood that the embodiments are illustrative only and not limiting. The broad principles of this invention are described in the following claims. In particular, the use of a thick single or multiple layer sandwich of metal, after the passivation layer is formed, to substantially eliminate the resistance of thin metal buses in a lateral power device is not intended to be limited to any particular formation process, and it includes, without limitation, any deposition or electroless or electroplating process.

I claim:

1. An integrated circuit die comprising:

a substrate comprising a semiconductor material, said substrate having a top surface;

a first metal conductive path having a length extending generally parallel to said top surface;

a first metal strap layer formed on a surface of said first metal conductive path, said first metal strap layer having a length extending generally parallel to said top surface, said first metal conductive path and said first metal strap layer being for conducting a current flow primarily in a direction parallel to said top surface of said substrate; and a passivation layer forming a portion of a top surface of said die, an upper surface of said first metal strap layer being located at a level above at least a portion of an upper surface of said passivation layer such that said passivation layer does not overlap said upper surface of said first metal strap layer.

2. The integrated circuit die of claim 1 wherein a side edge of said first metal conductive path extends laterally beyond a side edge of said first metal strap layer, said passivation layer covering a portion of said surface of said first metal conductive path.

3. The integrated circuit die of claim 1 wherein said upper surface of said passivation layer abuts a side edge of said first metal strap layer.

4. The integrated circuit die of claim 1 wherein said first metal strap layer comprises a layer of nickel.

5. The integrated circuit die of claim 1 wherein said first metal strap layer comprises an adhesion layer in contact with said first metal conductive path.

6. The integrated circuit die of claim 5 wherein said adhesion layer comprises titanium.

7. The integrated circuit die of claim 5 wherein said adhesion layer comprises zinc.

8. The integrated circuit die of claim 1 wherein said first metal strap layer comprises a surface layer covering a top surface of said first metal strap layer.

9. The integrated circuit die of claim 8 wherein said surface layer comprises gold.

10. The integrated circuit die of claim 8 further comprising a wire bonded to said surface layer.

11. The integrated circuit die of claim 10 wherein said wire comprises gold.

12. The integrated circuit die of claim 10 wherein said wire comprises aluminum.

13. The integrated circuit die of claim 1 wherein said first metal conductive path is included in a top metal layer, said die further comprising a lower metal layer which includes at least a second metal conductive path and a via extending between said first metal conductive path and said second metal conductive path so as to form an electrically conductive connection between said first and second metal conductive paths.

14. The integrated circuit die of claim 13 wherein said top metal layer further comprises a third metal conductive path and said lower metal layer further comprises a fourth metal conductive path substantially parallel to said second metal conductive path, a second via extending between said third metal conductive path and said fourth metal conductive path so as to form an electrically conductive connection between said third and fourth metal conductive paths.

15. The integrated circuit die of claim 14 wherein said second and fourth metal conductive paths are disposed diagonally with respect to said first and second metal conductive paths.

16. The integrated circuit die of claim 1 further comprising a power MOSFET.

17. The integrated circuit die of claim 16 wherein said power MOSFET is a lateral device.

18. The integrated circuit die of claim 1 further comprising a second metal conductive path, each of said first and second metal conductive paths having fingers that are interdigitated with fingers of the other metal conductive path.

19. The integrated circuit die of claim 1 wherein said die comprises a quasi-vertical double-diffused MOSFET.

20. The integrated circuit die of claim 1 wherein said die comprises a lateral MOSFET.

21. The integrated circuit die of claim 20 wherein a drain region of said lateral MOSFET includes a lightly-doped region.

22. The integrated circuit die of claim 20 wherein said MOSFET is an N-channel device.

23. The integrated circuit die of claim 22 wherein said MOSFET is formed in a P-well in said die.

24. The integrated circuit die of claim 22 wherein a drain region in said MOSFET includes a lightly-doped region.

25. The integrated circuit die of claim 22 wherein said MOSFET includes a body contact region which is shorted to a source region of said MOSFET.

26. The integrated circuit die of claim 22 wherein said MOSFET is a double-diffused device.

27. The integrated circuit die of claim 20 wherein said MOSFET is a P-channel device.

28. The integrated circuit die of claim 27 wherein said MOSFET is formed in an N-well in said die.

29. The integrated circuit die of claim 1 wherein said first metal strap layer is formed in longitudinal segments.

30. The integrated circuit die of claim 1 wherein said first metal strap layer is located only in areas of said die where there is an opening in said passivation layer.

31. The integrated circuit die of claim 1 further comprising a second metal conductive path and a second metal strap layer formed on a surface of said second metal conductive path, said first metal conductive path and said first metal strap layer forming a ground bus and said second metal conductive path and said second metal strap layer forming a supply voltage bus.

32. The integrated circuit die of claim 1 wherein said first metal strap layer is more than 12 μm thick.

33. The integrated circuit die of claim 32 wherein said first metal strap layer is less than 25 μm thick.

34. The integrated circuit die of claim 32 wherein said first metal strap layer is more than 20 μm thick.

35. The integrated circuit die of claim 34 wherein said first metal strap layer is less than 30 μm thick.

36. The integrated circuit die of claim 1 wherein said first metal conductive path and said first metal strap layer constitute at least a portion of a conductive path linking a first electronic component formed in said substrate with a second electronic component formed in said substrate.

37. An integrated circuit die comprising a semiconductor substrate and a bus, said bus being formed as an integral part of said integrated circuit die, said bus having a length extending generally in a direction parallel to a surface of said substrate and being for carrying a current in a direction parallel to said surface, said integrated circuit die further comprising a passivation layer which forms a portion of a top surface of said die, said bus having a top surface which is located at a level which is above at least a portion of an upper surface of said passivation layer such that said passivation layer does not overlap said top surface of said bus, said bus comprising a relatively thin lower layer which is located at a level below said upper surface of said passivation layer and a relatively thick upper layer having a bottom surface located at a level below said upper surface of said passivation layer and a top surface located at a level above said upper surface of said passivation layer.

38. The integrated circuit die of claim 37 wherein said bus further comprises an adhesion layer located between said upper and lower layers.

39. The integrated circuit die of claim 37 wherein said bus further comprises a bonding layer located above said upper layer.

40. The integrated circuit die of claim 37 wherein a vertical dimension of said bus is equal to 12 μm or more.

41. The integrated circuit die of claim 37 wherein said bus constitutes at least a portion of a conductive path linking a first electronic component formed in said substrate with a second electronic component formed in said substrate.

* * * * *